(12) United States Patent
Nakagawa et al.

(10) Patent No.: US 8,940,566 B2
(45) Date of Patent: Jan. 27, 2015

(54) SEMICONDUCTOR DEVICE, DISPLAY DEVICE, AND PRODUCTION METHOD FOR SEMICONDUCTOR DEVICE AND DISPLAY DEVICE

(75) Inventors: Okifumi Nakagawa, Osaka (JP); Yoshimasa Chikama, Osaka (JP); Takeshi Hara, Osaka (JP); Hiromitsu Katsui, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/883,014

(22) PCT Filed: Nov. 1, 2011

(86) PCT No.: PCT/JP2011/075155
§ 371 (c)(1),
(2), (4) Date: Oct. 9, 2013

(87) PCT Pub. No.: WO2012/060362
PCT Pub. Date: May 10, 2012

(65) Prior Publication Data
US 2014/0147966 A1    May 29, 2014

(30) Foreign Application Priority Data
Nov. 4, 2010    (JP) .................................. 2010-247156

(51) Int. Cl.
*H01L 21/00*    (2006.01)
*H01L 29/66*    (2006.01)
(Continued)

(52) U.S. Cl.
CPC .... *H01L 29/66969* (2013.01); *G02F 1/136227* (2013.01); *H01L 27/1225* (2013.01);
(Continued)

(58) Field of Classification Search
CPC .......................... H01L 29/45; H01L 29/78609
USPC ............ 438/85, 34; 257/646, 258, 43; 349/42
See application file for complete search history.

(56) References Cited

U.S. PATENT DOCUMENTS 5,892,284 A * 4/1999 Asano ........................... 257/758
6,501,096 B1   12/2002 Hashimoto et al.
(Continued)

FOREIGN PATENT DOCUMENTS

JP    06-244171 A    9/1994
JP    2001-242443 A    9/2001
(Continued)

OTHER PUBLICATIONS

Official Communication issued in International Patent Application No. PCT/JP2011/075155, mailed on Jan. 24, 2012.
(Continued)

*Primary Examiner* — Caridad Everhart
(74) *Attorney, Agent, or Firm* — Keating & Bennett, LLP

(57) ABSTRACT

The semiconductor device (100) according to the present invention includes a gate electrode (102) of a TFT, a gate insulating layer (103) formed on the gate electrode (102), an oxide semiconductor layer (107) disposed on the gate insulating layer (103), a protecting layer (108) formed on the oxide semiconductor layer (107) by a spin-on-glass technique, and a source electrode (105) and a drain electrode (106) disposed on the protecting layer (108). Via a first contact hole (131) formed in the protecting layer (108), the source electrode (105) is electrically connected to the oxide semiconductor layer (104), and via a second contact hole (132), the drain electrode (106) is electrically connected to the oxide semiconductor layer (104).

18 Claims, 26 Drawing Sheets

(51) Int. Cl.
  *G02F 1/1362* (2006.01)
  *H01L 27/12* (2006.01)
  *H01L 29/786* (2006.01)
  *H01L 29/417* (2006.01)

(52) U.S. Cl.
  CPC ...... *H01L 29/7869* (2013.01); *H01L 29/41733* (2013.01); *H01L 29/66742* (2013.01); *H01L 29/78606* (2013.01); *G02F 2001/136231* (2013.01)
  USPC .............................................. 438/34; 438/85

(56) References Cited

U.S. PATENT DOCUMENTS

| | | | |
|---|---|---|---|
| 7,435,668 B2 * | 10/2008 | Machida et al. | ............... 438/487 |
| 2006/0043447 A1 | 3/2006 | Ishii et al. | |
| 2007/0052025 A1 | 3/2007 | Yabuta | |
| 2009/0140243 A1 | 6/2009 | Kim et al. | |
| 2009/0155940 A1 | 6/2009 | Lee et al. | |
| 2009/0256147 A1 * | 10/2009 | Kim et al. | ........................ 257/43 |
| 2010/0163867 A1 | 7/2010 | Yamazaki et al. | |
| 2010/0301328 A1 * | 12/2010 | Yamazaki et al. | .............. 257/43 |
| 2011/0079784 A1 * | 4/2011 | Im | .................... 257/59 |
| 2014/0071367 A1 * | 3/2014 | Lee et al. | ........................ 349/43 |

FOREIGN PATENT DOCUMENTS

| | | |
|---|---|---|
| JP | 2006-100760 A | 4/2006 |
| JP | 2007-073705 A | 3/2007 |
| JP | 2008-170664 A | 7/2008 |
| JP | 2010-171406 A | 8/2010 |

OTHER PUBLICATIONS

English translation of Official Communication issued in corresponding International Application PCT/JP2011/075155, mailed on May 16, 2013.

* cited by examiner (a)

(b)

(c)

(d)

(e)

(f)

(g)

(a)

(b)

(c)

(a)

(b)

(c)

(d)

(e)

(f)

(g)

(a)

(b)

(c)

(d)

(e)

(f)

(g)

(a)

(b)

(c)

(d)

(e)

(f)

(g)

(a)

(b)

(c)

(d)

(e)

(f)

(a)

(b)

(c)

(d)

(e)

(a)

(b)

(c)

(d)

(e)

(f)

(g)

(a)

(b)

(c)

(d)

(e)

(f)

(g)

(h)

(a)

(b)

(c)

(d)

(e)

(f)

(g)

(a)

(b)

SEMICONDUCTOR DEVICE, DISPLAY DEVICE, AND PRODUCTION METHOD FOR SEMICONDUCTOR DEVICE AND DISPLAY DEVICE

TECHNICAL FIELD

The present invention relates to a semiconductor device and a display device provided with thin film transistors, and production method of a semiconductor device and a display device provided with thin film transistors.

BACKGROUND ART

An active matrix liquid crystal display device or an organic EL (Electro Luminescence) display device generally includes: a substrate on which a thin film transistor (Thin Film Transistor; hereinafter referred to as "TFT") is formed as a switching element for each pixel (hereinafter referred to as "a TFT substrate"; a counter substrate on which a counter electrode, a color filter, and the like are formed; and an optical modulation layer such as a liquid crystal layer disposed between the TFT substrate and the counter substrate.

On the TFT substrate, a plurality of source lines, a plurality of gate lines, a plurality of TFTs respectively disposed at the crossings thereof, a pixel electrode for applying a voltage across the optical modulation layer such as the liquid crystal layer, a storage capacitor line and a storage capacitor electrode, and the like are formed.

The configuration of the TFT substrate is disclosed, for example, in Patent Document 1. Hereinafter, with reference to the drawings, the configuration of the TFT substrate disclosed in Patent Document 1 will be described.

FIG. 29(a) is a schematic plan view generally showing the TFT substrate, and FIG. 29(b) is an enlarged plan view showing one of the pixels in the TFT substrate. FIG. 30 is a sectional view of a TFT and a terminal portion in a semiconductor device shown in FIG. 29.

As shown in FIG. 29(a), the TFT substrate has a plurality of gate lines 2016 and a plurality of source lines 2017. Respective regions enclosed by these lines 2016 and 2017 constitute "pixels". In an area 2040 excluding the area in which the pixels are formed (a display area) of the TFT substrate, a plurality of connecting portions 2041 for connecting the plurality of gate lines 2016 and source lines 2017 to a driving circuit, respectively, are disposed. Each connecting portion 2041 constitutes a terminal portion for the connection to external lines.

As shown in FIG. 29(b) and FIG. 30, a pixel electrode 2020 is provided so as to cover respective regions 2021 which will be pixels. In each region 2021, a TFT is formed. The TFT includes a gate electrode G, gate insulating films 2025 and 2026 which covers the gate electrode G, a semiconductor layer 2019 disposed on the gate insulating film 2026, and a source electrode S and a drain electrode D connected respectively to end portions of the semiconductor layer 2019. The TFT is covered with a protecting film 2028. An interlayer insulating film 2029 is formed between the protecting film 2028 and the pixel electrode 2020. The source electrode S of the TFT is connected to a source line 2017, and the gate electrode G is connected to a gate line 2016. The drain electrode D is connected to the pixel electrode 2020 in a contact hole 2030.

A storage capacitor line 2018 is formed in parallel to the gate line 2016. The storage capacitor line 2018 is connected to a storage capacitor. Herein the storage capacitor is constituted by a storage capacitor electrode 2018b formed from the same conductive film as the drain electrode, a storage capacitor electrode 2018a formed from the same conductive film as the gate line, and a gate insulating film 2026 positioned between them.

On the connecting portion 2041 extending from each of the gate lines 2016 and the source lines 2017, the gate insulating films 2025 and 2026 and the protecting film 2028 are not formed, but a connecting line 2044 is formed so as to be in contact with the upper surface of the connecting portion 2041. With such a configuration, electric connection between the connecting portion 2041 and the connecting line 2044 is ensured.

As shown in FIG. 30, in a liquid crystal display device, a TFT substrate is disposed so as to be opposed to a substrate 2014 on which a counter electrode and a color filter are formed with a liquid crystal layer 2015 interposed therebetween.

When such a TFT substrate is produced, it is preferred that a region 2021 which will be a pixel (also referred to as "a pixel portion") and a terminal portion are formed by a common process, so as to suppress the increases in the number of masks and in the number of process steps.

In order to produce the above-mentioned TFT substrate, it is necessary to perform the etching of a portion positioned in a terminal arranging area 2040 of the gate insulating films 2025 and 2026 and the protecting film 2028 and a portion positioned in a region in which the storage capacitor is formed of the gate insulating film 2025 and the insulating film 2028. Patent Document 1 discloses that an interlayer insulating film 2029 is formed by using an organic insulating film, and by using the film as a mask, these insulating films 2025, 2026, and 2028 are etched.

Recently, it is proposed that, instead of the silicon semiconductor film, an oxide semiconductor film such as zinc oxide is used for forming a channel layer of a TFT. Such a TFT is referred to as "an oxide semiconductor TFT". Since the oxide semiconductor has higher mobility than amorphous silicon, the oxide semiconductor TFT can operate at higher speed than the amorphous silicon TFT. The oxide semiconductor film is formed by a process which is simpler and easier than a polycrystalline silicon film, so that it can be applied to a device which is required to have a larger area.

Patent Document 2 discloses an example of a semiconductor device provided with an oxide semiconductor TFT of inverted stagger type. FIG. 22 of this document depicts that, on the source and drain electrodes of the oxide semiconductor TFT, an insulating layer is formed by sputtering, SOG, spin coating, or other techniques.

Patent Document 3 discloses an example of an oxide semiconductor TFT of inverted staggered type. The document describes that the semiconductor is oxidized by forming a liquid oxidizer material "self-assembled monolayer (SAM)" on the channel layer of the oxide semiconductor.

Patent Document 4 discloses an example of an oxide semiconductor TFT of staggered type. In this example, the channel layer and the source and drain electrodes are covered with a protecting layer of $SiN_x$, $SiO_2$, or an organic matter.

CITATION LIST

Patent Literature

Patent Document 1: Japanese Laid-Open patent Publication No. 2008-170664
Patent Document 2: Japanese Laid-Open Patent Publication No. 2010-171406

Patent Document 3: U.S. Patent Application Publication No. 2009/0140243

Patent Document 4: Japanese Laid-Open Patent Publication No. 2007-73705

SUMMARY OF INVENTION

Technical Problem

However, in the oxide semiconductor TFT, during the production process of the TFT, for example, in the step of thermal treatment or the like, carrier electrons are created due to oxygen defect, thereby disadvantageously degrading the resistance. In addition, in the etching step of the source and drain electrodes, or the step of forming an insulating layer thereon, there exists a problem that the oxide semiconductor film positioned below may be damaged by reduction or the like.

In recent years, as the material for oxide semiconductors, IGZO ($InGaZnO_x$) receives much attention. As the result of the study by the inventors of the present invention, it was found that in the case where IGZO or the like was used for the oxide semiconductor, when a metal layer functioning as the source and drain electrodes was layered on the oxide semiconductor layer, the channel layer was damaged by plasma CVD or other processes, thereby degrading the characteristics of the TFT. In addition, it was found that due to the damage by photolithography in the shaping of the metal layer, or due to the damage in the annealing of an insulating layer or the like on the channel layer, the composition changes of the TFT and the deterioration in characteristics of the TFT were caused. It was considered that the deterioration in characteristics of the TFT was caused by excessive oxygen deficiency generated in the channel layer due to the damage, so as to increase the leakage current. Accordingly, it was considered that the ON-OFF current ratio of the TFT was deviated from predetermined values, so as not to obtain desired characteristics.

Patent Document 2 describes that in the semiconductor device, two insulating layers are formed for protecting the TFT. However, since the insulating layers are formed on the source and drain electrodes, the damage to the channel portion by dry etching in the step of forming the source and drain electrodes, the damage caused by a residue in the channel portion after the wet etching, or other damages cannot be prevented by the insulating layers.

In the production process of the semiconductor device in Patent Document 3, after the source and drain electrodes are formed on the gate insulating layer, the channel layer is formed, and thereafter an SAM layer is formed only on the channel layer for oxidizing the channel layer. On the channel layer on which the SAM layer is formed, and on the source and drain electrodes, an active layer is formed. However, this document does not describe a special method for protecting the channel layer from the above-described damages after forming the channel layer.

In the semiconductor device of stagger type in Patent Document 4, a source electrode and a drain electrode are formed on a plastic substrate, and a channel layer is formed between the source electrode and the drain electrode. On the channel layer, a gate insulating film and a gate electrode are formed in this order. In addition, a protecting film is formed so as to cover the TFT. The protecting film is formed after the gate insulating layer and the gate electrode are formed on the channel layer. The protecting film will not reduce the damage to the channel layer when the gate insulating layer and the gate electrode are formed.

The present invention has been conducted in view of the above-described prior art, and the objective of the present invention is to produce a semiconductor device having excellent TFT characteristics with good production efficiency by reducing the damage to a channel layer caused in the production of an oxide semiconductor TFT. In addition, another objective of the present invention is to produce a display device provided with such a semiconductor device as a TFT substrate with high performance and high production efficiency.

Solution to Problem

The production method of a semiconductor device according to the present invention is a production method of a semiconductor device provided with a thin film transistor, including the steps of:

(A1) forming a gate electrode of the thin film transistor on a substrate;

(B1) forming a gate insulating layer so as to cover the gate electrode;

(C1) forming an oxide semiconductor layer of the thin film transistor on the gate insulating layer;

(D1) forming a protecting layer by a spin-on-glass technique so as to cover the oxide semiconductor layer;

(E1) forming a first and a second contact holes in the protecting layer; and (F1) forming a source electrode and a drain electrode of the thin film transistor on the protecting layer, wherein the source electrode is formed to be electrically connected to the oxide semiconductor layer via the first contact hole, and the drain electrode is formed to be electrically connected to the oxide semiconductor layer via the second contact hole.

In one embodiment, the step (D1) of forming the protecting layer includes: a step of applying a spin-on-glass material on the oxide semiconductor layer and the gate insulating layer by the spin-on-glass technique; and a step of sintering the applied spin-on-glass material.

In one embodiment, in the sintering step, the protecting layer of silicon oxide is obtained due to dehydration polymerization reaction of the spin-on-glass material.

In one embodiment, the spin-on-glass material includes silanol, alkoxysilane, or an organic siloxane resin.

In one embodiment, the sintering temperature in the sintering step is 200 to 450° C.

In one embodiment, the production method further includes the steps of: forming an interlayer insulating layer so as to cover the source electrode and the drain electrode; forming a third contact hole in the interlayer insulating layer; and forming a transparent electrode on the interlayer insulating layer so as to be connected to the drain electrode via the third contact hole.

In one embodiment, the production method further includes the steps of: forming a second protecting layer so as to cover the source electrode and the drain electrode; forming the interlayer insulating layer on the second protecting layer; forming a third contact hole in the second protecting layer and the interlayer insulating layer; and forming a transparent electrode on the interlayer insulating layer so as to be connected to the drain electrode via the third contact hole.

In one embodiment, the production method includes, after the step (F1), a step of forming a second transparent electrode on the source electrode and the drain electrode and in the first and second contact holes, wherein the source electrode and the drain electrode are electrically connected to the oxide semiconductor layer via the second transparent electrode in the first and second contact holes, respectively.

In one embodiment, the production method further includes a step of forming a transparent electrode so as to be directly in contact with the drain electrode.

In one embodiment, the production method includes, after the step (F1), a step of forming a transparent electrode on the source electrode and the drain electrode and in the first and second contact holes, wherein the source electrode and the drain electrode are electrically connected to the oxide semiconductor layer via the transparent electrode in the first and second contact holes, respectively.

The production method of a display device according to the present invention is a production method of a display device including a transistor portion having a thin film transistor, a Cs portion having a pixel electrode and a storage capacitor, and a terminal portion having a connecting portion for connecting an upper layer wiring and a lower layer wiring, including the steps of:

(A2) forming a gate electrode, a gate insulating layer, and an oxide semiconductor layer of the thin film transistor, the storage capacitor of the Cs portion, and the lower layer wiring of the terminal portion, on a substrate;

(B2) forming a protecting layer by a spin-on-glass technique so as to cover the oxide semiconductor layer, the storage capacitor, and the lower layer wiring;

(C2) forming a source electrode and a drain electrode of the thin film transistor, and the upper layer wiring of the terminal portion, on the protecting layer;

(D2) forming a first and a second contact holes in the protecting layer in the transistor portion, forming a third contact hole in the protecting layer on the storage capacitor, and removing the protecting layer on at least part of the lower layer wiring of the terminal portion; and (E2) forming a transparent electrode on the first, second, and third contact holes, and in the terminal portion, wherein the source electrode and the drain electrode, and the oxide semiconductor layer are electrically connected via the transparent electrode, the transparent electrode and a counter electrode of the storage capacitor are electrically connected in the Cs portion, and the lower layer wiring and the upper layer wiring are electrically connected via the transparent electrode in the terminal portion.

In one embodiment, the step (B2) of forming the protecting layer includes: a step of applying a spin-on-glass material onto the oxide semiconductor layer and the gate insulating layer by a spin-on-glass technique; and a step of sintering the applied spin-on-glass material.

In one embodiment, in the sintering step, the protecting layer of silicon oxide is obtained due to dehydration polymerization reaction of the spin-on-glass material.

In one embodiment, the spin-on-glass material includes silanol, alkoxysilane, or an organic siloxane resin.

The sintering temperature in the sintering step is 200 to 450° C.

In one embodiment, the production method includes, between steps (C2) and (D2): a step of forming an interlayer insulating layer so as to cover the source electrode, the drain electrode, and the upper layer wiring; a step of forming a second protecting layer on the interlayer insulating layer; and a step of forming a plurality of contact holes in the second protecting layer, wherein in the step (D2), the interlayer insulating layer and the protecting layer under the plurality of contact holes are removed, thereby forming the first, second and third contact holes.

In one embodiment, in the step (E2), the transparent electrode is formed so as to be directly in contact with the source electrode and the drain electrode of the thin film transistor, the counter electrode of the storage capacitor, and the lower layer wiring and the upper layer wiring of the terminal portion.

In one embodiment, the step (C2) is performed after the steps (D2) and (E2), thereby forming the source electrode, the drain electrode, and the upper layer wiring of the terminal portion on the transparent electrode.

The semiconductor device of the present invention is a semiconductor device provided with a thin film transistor, including: a gate electrode of the thin film transistor; a gate insulating layer formed on the gate electrode; an oxide semiconductor layer of the thin film transistor formed on the gate insulating layer; a protecting layer formed on the oxide semiconductor layer by a spin-on-glass technique; and a source electrode and a drain electrode of the thin film transistor disposed on the protecting layer, wherein in the protecting layer, a first contact hole and a second contact hole are formed, the source electrode is electrically connected to the oxide semiconductor layer via the first contact hole, and the drain electrode is electrically connected to the oxide semiconductor layer via the second contact hole.

In one embodiment, the protecting layer is a layer obtained by applying a spin-on-glass material onto the oxide semiconductor layer and the gate insulating layer by a spin-on-glass technique, and by sintering the applied spin-on-glass material.

In one embodiment, the protecting layer is a silicon oxide film obtained by dehydration polymerization reaction of the spin-on-glass material.

In one embodiment, the protecting layer is a layer obtained by the sintering at temperatures of 200 to 450° C.

The display device according to the present invention is a display device including the above-mentioned semiconductor device.

In one embodiment, the display device is provided with a transistor portion including the thin film transistor, a Cs portion including a pixel electrode and a storage capacitor, and a terminal portion including a connecting portion for connecting an upper layer wiring and a lower layer wiring, wherein a third contact hole is formed in the protecting layer on the storage capacitor, and a transparent electrode is formed on the first, second, and third contact holes and in the terminal potion, the source electrode and the drain electrode, and the oxide semiconductor layer being electrically connected via the transparent electrode, the transparent electrode and a counter electrode of the storage capacitor being electrically connected in the Cs portion, and the lower layer wiring and the upper layer wiring being electrically connected via the transparent electrode in the terminal portion.

Advantageous Effects Of Invention

According to the present invention, the protecting layer is formed on the oxide semiconductor layer by the spin-on-glass technique, so that the damage to the oxide semiconductor layer by sputtering, etching, annealing, or other processes in forming the upper layers such as the source and drain electrodes can be prevented or reduced. Accordingly, the deterioration in characteristics of the semiconductor device and the display device having the oxide semiconductor TFT can be prevented, and it is possible to provide a semiconductor device and a display device with high quality and high reliability.

According to the present invention, the protecting layer of the spin-on-glass material is formed so as to be in contact with the oxide semiconductor layer, so that $H_2O$ or —OH radical is diffused from the spin-on-glass material into the oxide semiconductor layer in the production, whereby the defect of the oxide semiconductor is restored. Accordingly, the deterioration in characteristics of the semiconductor device and the display device having the oxide semiconductor TFT can be prevented, and it is possible to provide a semiconductor device and a display device with high quality and high reliability.

According to the present invention, the configuration in which the spin-on-glass material layer is formed on the oxide semiconductor layer, and the source electrode and the drain electrode are connected to the oxide semiconductor layer via the contact hole can be adopted. Thus, the damage to the channel layer due to the etching when the source electrode and the drain electrode are formed, or the plasma damage due to CVD caused after the forming of the oxide semiconductor layer can be prevented.

According to the present invention, when the oxide semiconductor TFT with high quality is formed, the storage capacitor or the terminal portion of the display device is simultaneously formed. Accordingly, it is possible to provide a display device with high quality and high reliability with good production efficiency.

DESCRIPTION OF EMBODIMENTS

Hereinafter with reference to the drawings, a semiconductor device, a display device, and production methods of the semiconductor device and the display device in the embodiments of the present invention will be described. It should be noted that the scope of the present invention is not limited to the embodiments described below. The semiconductor device of the present invention is a TFT substrate in which an oxide semiconductor TFT is formed, and widely includes TFT substrates of various display devices, electronic equipment, and the like. In the following description of the embodiments, the semiconductor device is a TFT substrate for a display device which includes an oxide semiconductor TFT as a switching element.

Embodiment 1

Figure 1:
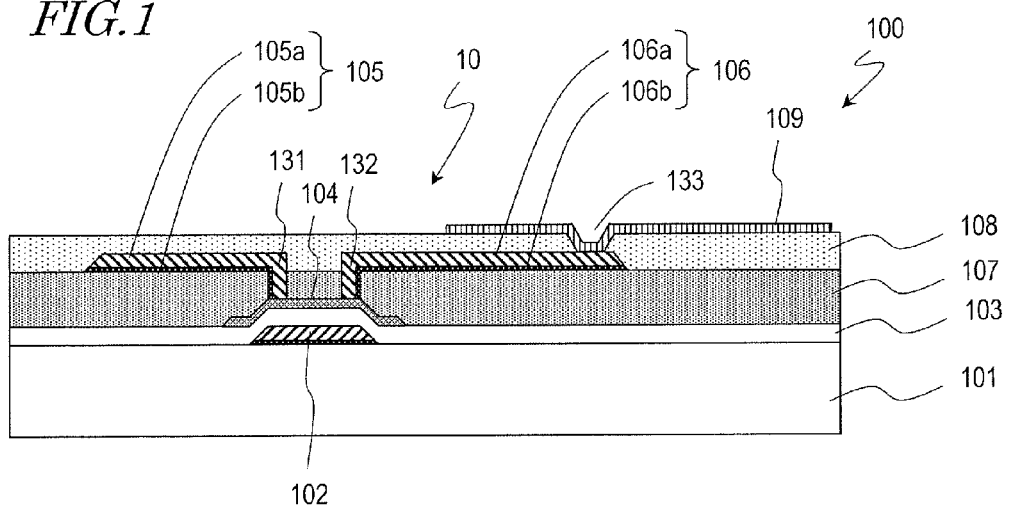
FIG. 1 is a sectional view showing the configuration of a semiconductor device 100 in Embodiment 1 of the present invention.

FIG. 1 is a sectional view schematically showing the configuration of a semiconductor device 100 (sometimes referred to as "a TFT substrate 100") in Embodiment 1 of the present invention.

The semiconductor device 100 includes a thin film transistor 10. The thin film transistor 10 includes a gate electrode 102 formed on a substrate 101 such as a glass substrate, a gate insulating layer 103 (sometimes referred to simply as "an insulating layer 103") formed on the gate electrode 102, an oxide semiconductor layer 104 formed on the gate insulating layer 103, a protecting layer (an SOG layer) 107 disposed on the gate insulating layer 103 so as to cover the oxide semiconductor layer 104, a source electrode 105 and a drain electrode 106 formed on the protecting layer 107, an interlayer insulating layer 108 (sometimes referred to simply as "an insulating layer 108") formed on the source electrode 105 and the drain electrode 106, and a transparent electrode 109 formed on the interlayer insulating layer 108.

In the protecting layer 107, a contact hole (a first contact hole) 131 and a contact hole (a second contact hole) 132 are formed. The source electrode 105 is in contact with the oxide semiconductor layer 104 at the bottom of the contact hole 131. The drain electrode 106 is in contact with the oxide semiconductor layer 104 at the bottom of the contact hole 132. In other words, the source electrode 105 and the drain electrode 106 are electrically connected to the oxide semiconductor layer 104 via the contact holes 131 and 132, respectively.

The transparent electrode 109 can function as a pixel electrode, so that the transparent electrode 109 is sometimes referred to as "a pixel electrode 109". In the interlayer insulating layer 108 under the transparent electrode 109, a contact hole (a third contact hole) 133 is formed. The transparent electrode 109 is in contact with the drain electrode 106 at the bottom of the contact hole 133.

The protecting layer 107 is a silicon oxide film obtained by dehydration polymerization reaction in which a spin-on-glass (SOG) material containing silanol ($Si(OH)_4$), for example, is applied by spin coating, and the applied spin-on-glass material is sintered (an SOG technique). As the spin-on-glass material, a material containing alkoxysilane, organic siloxane resin, or the like can be used, instead of silanol.

The source electrode 105 has a two-layer structure in which on a lower layer source electrode 105b of e.g. titan (Ti), an upper layer source electrode 105a of e.g. copper (Cu) is formed. The drain electrode 106 also has a two-layer structure in which on a lower layer drain electrode 106b of e.g. titan an upper layer drain electrode 106a of e.g. copper is formed. The transparent electrode 109 is connected to the upper layer drain electrode 106a via the contact hole 133.

The gate electrode 102 may also have a two-layer structure in which on a lower layer gate electrode of e.g. titan, an upper layer gate electrode of e.g. copper is formed. The gate electrode 102 may alternatively have a three-layer structure of Ti/Al(aluminum)/Ti, or the like.

Figure 2:
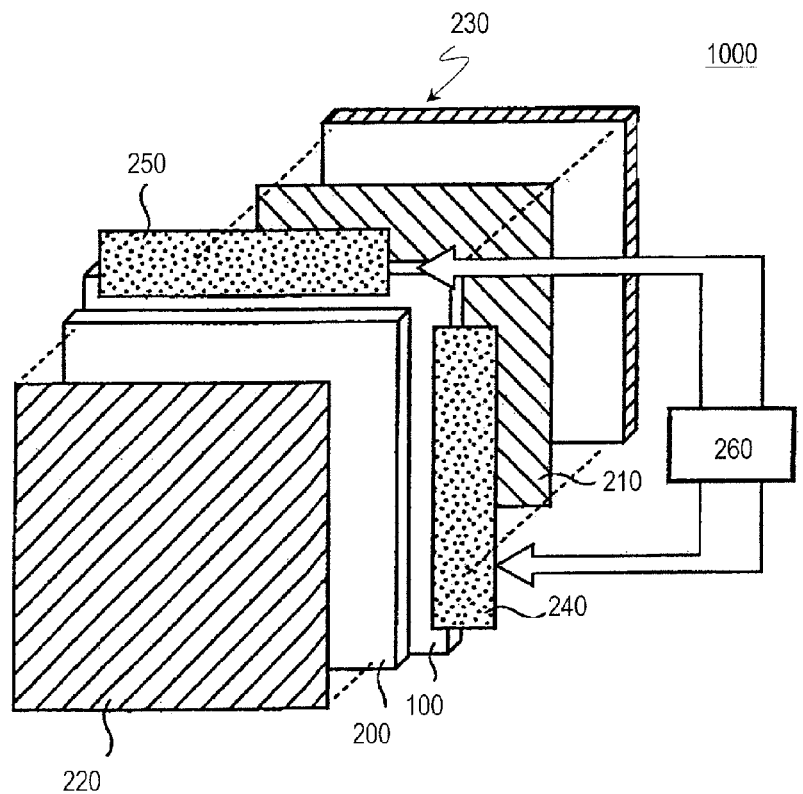
FIG. 2 is a perspective view schematically showing the configuration of a liquid crystal display device 1000 in Embodiment 1 of the present invention.

FIG. 2 is a perspective view schematically showing the configuration of a liquid crystal display device 1000 in one embodiment of the present invention. In this embodiment, the liquid crystal display device 1000 includes the above-described semiconductor device 100 as its TFT substrate. The liquid crystal display device 1000 may alternatively include semiconductor devices of Embodiments 2 to 12 which will be described below as its TFT substrate.

As shown in FIG. 2, the liquid crystal display device 1000 includes the semiconductor device (the TFT substrate) 100 and a counter substrate 200 which are opposed to each other with a liquid crystal layer interposed therebetween, polarizing plates 210 and 220 disposed on the respective outer sides of the TFT substrate 100 and the counter substrate 200, and a backlight unit 230 for emitting light for display to the TFT substrate 100. On the TFT substrate 100, a scanning line driving circuit 240 for driving a plurality of scanning lines (gate bus lines) and a signal line driving circuit 250 for driving a plurality of signal lines (data bus lines) are disposed. The scanning line driving circuit 240 and the signal line driving circuit 250 are connected to a control circuit 260 which is disposed on the inner side or on the outer side of the TFT substrate 100. In accordance with the control by the control circuit 260, a scanning signal for switching the on-off of the TFTs is supplied from the scanning line driving circuit 240 to the plurality of scanning lines, and a display signal (an applied voltage to the pixel electrode 109) is supplied from the signal line driving circuit 250 to a plurality of signal lines.

The counter substrate 200 is provided with color filters and a common electrode. In the case of three primary color display, the color filters include R (red) filters, G (green) filters, and B (blue) filters disposed in a corresponding manner to the pixels, respectively. The common electrode is formed so as to cover the plurality of pixel electrodes 109 with the liquid crystal layer interposed therebetween. In accordance with the potential difference applied across the common electrode and the respective pixel electrodes 109, liquid crystal molecules between the electrodes are aligned for each pixel, thereby performing display.

Figure 3:
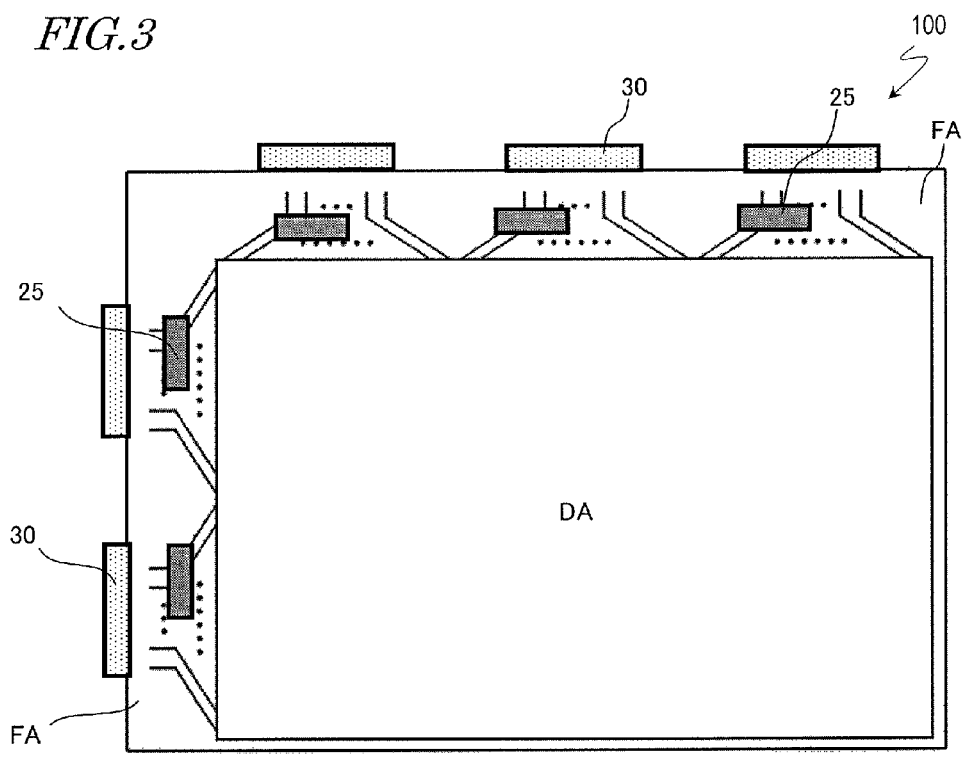
FIG. 3 is a plan view schematically showing the configuration of a TFT substrate (the semiconductor device 100) of the liquid crystal display device 1000.
Figure 4:
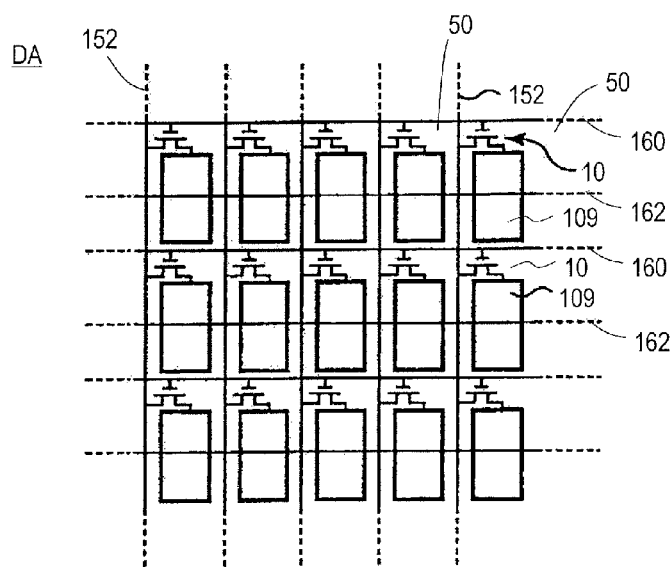
FIG. 4 is a plan view schematically showing the configuration of a display area DA of the TFT substrate 100.

FIG. 3 is a plan view schematically showing the configuration of the TFT substrate 100, and FIG. 4 is a plan view schematically showing the configuration of a display area DA of the TFT substrate 100.

As shown in FIG. 3, the TFT substrate 100 has a display area DA and a fringe area FA positioned on the outer side of the display area. In the fringe area FA, the scanning line driving circuit 240, the signal line driving circuit 250, and electric elements 25 such as a voltage supplying circuit are disposed by a COG (Chip on Glass) technology. In the vicinity of an outer edge portion of the fringe area FA, terminal portions 30 for attaching external elements such as FPC (Flexible Printed Circuits) are provided.

In the display area DA, as shown in FIG. 4, a plurality of pixels 50 are disposed in a matrix, and a plurality of scanning lines 160 and a plurality of signal lines 152 are disposed so as to be orthogonal to each other. In the vicinity of respective intersections of the plurality of scanning lines 160 and the plurality of signal lines 152, thin film transistors (TFTs) 10 as active elements are formed for pixels 50, respectively. In each of the pixels 50, a pixel electrode 109 of e.g. ITO (Indium Tin Oxide) is disposed. The pixel electrode 109 is electrically connected to the drain electrode 106 of the TFT 10. Between two scanning lines 160 which are adjacent to each other, a storage capacitor line (also referred to as a Cs line) 162 extends in parallel to the scanning lines 160. In each pixel 10, a storage capacitor (Cs) is formed. Part of the storage capacitor line 162 functions as a storage capacitor electrode (a lower electrode) of the storage capacitor. Part of the scanning line 160 functions as the gate electrode 102. The gate electrode 102, the scanning line 160, the storage capacitor electrode, and the storage capacitor electrode are formed from the same material and by the same process.

Although not shown in the figure, on the boundary between the display area DA and the fringe area FA, a plurality of connecting lines are formed. Each signal line 152 is electrically connected to a connecting line via a connecting portion formed correspondingly to the signal line. By the connecting portion, the signal line 152 as an upper layer wiring is connected to a connecting line as a lower layer wiring. The drain electrode 106 of the TFT 10 is connected to a storage capacitor counter electrode as an upper electrode of the storage capacitor. The storage capacitor counter electrode is connected to the pixel electrode 109 via a contact hole formed in the interlayer insulating layer 108.

On the side of the fringe area FA, another connecting portion is disposed. In the connecting portion of the fringe area FA, the connecting line is connected to the upper layer wiring of the fringe area FA, and the upper layer wiring is connected to the electric element 25. The scanning line 160 as the lower layer wiring is connected to the upper layer wiring of the fringe area FA by the connecting portion, and then connected to the electric element 25. The electric element 25 and the terminal portion 30 are connected via a plurality of wirings.

Next, with reference to FIG. 5, the production method of the TFT substrate 100 will be described.

Figure 5:
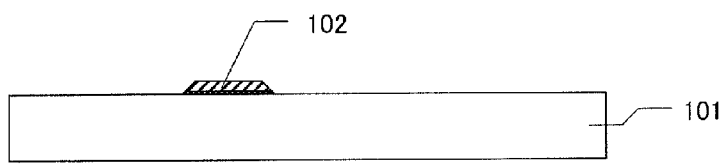
In FIG. 5, (a) to (g) are sectional views schematically showing the production process of the semiconductor device 100 in Embodiment 1.
Figure 5:
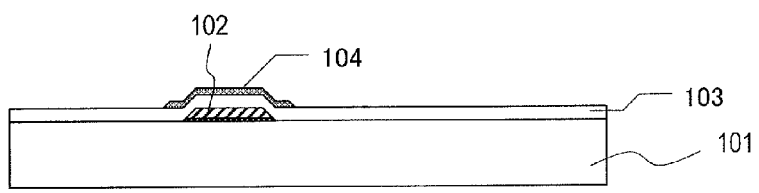
Figure 5:
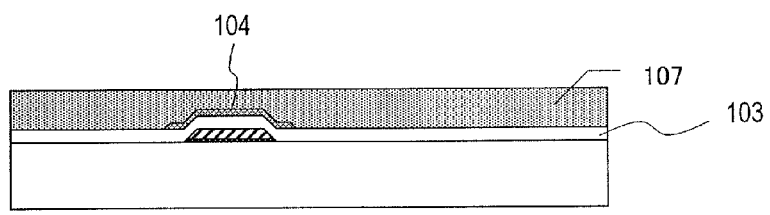
Figure 5:
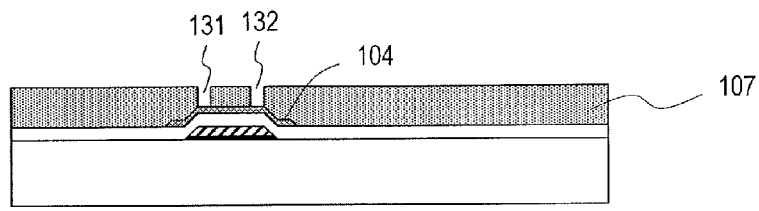
Figure 5:
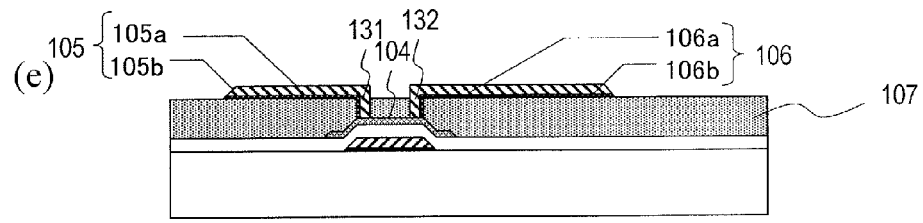
Figure 5:
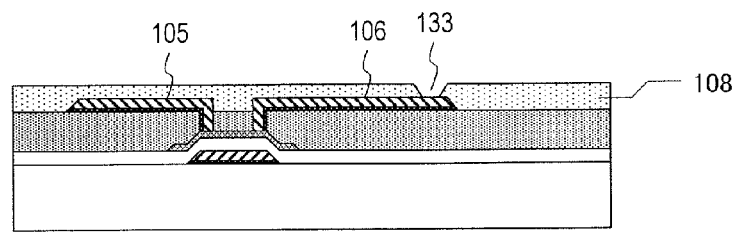
Figure 5:
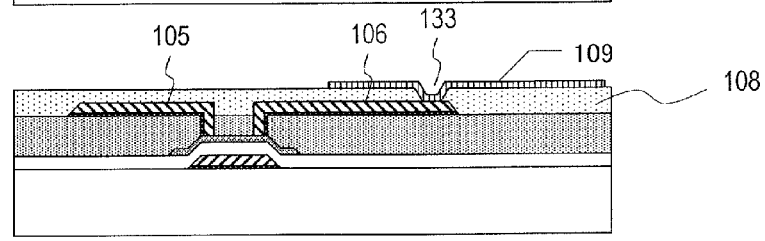

In FIG. 5, (a) to (g) are schematic sectional views showing the production process steps of the TFT substrate 100.

Step (A1):

First, a Ti layer and a Cu layer are layered in this order on a substrate 101 by sputtering or other techniques. The thickness of the Ti layer is 30 to 150 nm, and the thickness of the Cu layer is 200 to 500 nm. Next, the layered two layers are patterned by known photolithography and wet etching (the first mask process), thereby obtaining a gate electrode 102 shown in FIG. 5(*a*). At this time, scanning lines 160 and storage capacitor electrodes which are not shown are simultaneously formed. Thereafter, the remaining resist is peeled off and the substrate is cleaned.

Step (B1):

Next, on the substrate 101, a gate insulating layer 103 is formed so as to cover the gate electrode 102. The gate insulating layer 103 has a two layer configuration including a silicon nitride (SiNx) film layered to the thickness of 100 to 500 nm by CVD and a silicon oxide (SiO$_2$) film layered thereof to the thickness of 10 to 200 nm by CVD. The gate insulating layer 103 may be a single layer film of silicon nitride or silicon oxide.

Step (C1):

Next, an oxide semiconductor is layered on the gate insulating layer 103. The oxide semiconductor is formed by layering In—Ga—Zn—O semiconductor (IGZO), for example, to the thickness of 10 to 100 nm by sputtering. Thereafter, the layered oxide semiconductor is patterned by photolithography and wet etching (the second mask process), thereby obtaining an oxide semiconductor layer 104 functioning as a channel layer of a thin film transistor 10 as shown in FIG. 5(*b*). Thereafter, the remaining resist is peeled off and the substrate is cleaned. As the oxide semiconductor, instead of IGZO, another kind of oxide semiconductor film may be utilized.

Step (D1):

Next, as shown in FIG. 5(*c*), on the gate insulating layer 103, an SOG material is applied by spin coating so as to cover the oxide semiconductor layer 104, and the applied SOG material is sintered. Instead of the spin coating, an applying technique which utilizes a slit coater may be adopted. Preferably, the sintering temperature is 200 to 450 degrees. In this embodiment, the sintering is performed at 350 degrees. As the result of the sintering, the dehydration polymerization reaction of the SOG material is performed, and a protecting layer 107 of silicon oxide having the thickness of 100 to 3000 nm is formed (the formation of the protecting layer 107 by SOG). As the SOG material, for example, a material containing silanol, alkoxysilane, or an organic siloxane resin as a base material is used.

At this time, H$_2$O or —OH radical generated by the sintering of the SOG material is diffused into the oxide semiconductor from the upper surface and the side face of the oxide semiconductor layer, so that the defect of the oxide semiconductor is uniformly restored. In addition, the SOG material is applied by spin coating, so that the damage to the oxide semiconductor layer which may be caused by the use of sputtering, photolithography, etching, or other techniques can be prevented.

By the provision of the protecting layer 107, the damage to the oxide semiconductor layer from the sputtering, the photolithography, the etching, the heat treatment, and the like in the succeeding steps for forming layers can be prevented or reduced. In addition, when the SOG material is sintered, the oxide semiconductor layer can be annealed, so that it is unnecessary to add another annealing step. Thus, the production efficiency can be improved.

Step (E1):

Next, as shown in FIG. 5(*d*), by using photolithography and dry etching, contact holes 131 and 132 are formed in the protecting layer 107 (the third mask process).

Step (F1):

Next, by sputtering, Ti and Cu are layered in this order on the protecting layer 107 so as to bury the contact holes 131 and 132. The thickness of the Ti layer is 20 to 150 nm, and the thickness of the Cu layer is 100 to 600 nm. Next, by photolithography and wet etching, the two layers of Cu/Ti are patterned, thereby obtaining a source electrode 105 and a drain electrode 106 as shown in FIG. 5(*e*) (the fourth mask process). Thereafter, the remaining resist is removed, and the substrate is cleaned.

The source electrode 105 is constituted by a lower layer source electrode 105*b* of Ti, and an upper layer source electrode 105*a* of Cu. The drain electrode 106 is constituted by a lower layer source electrode 106*b* of Ti, and an upper layer source electrode 106*a* of Cu. Herein, the upper layer source electrode 105*a* is formed so that the width thereof is narrower than that of the lower layer source electrode 105*b*, and the upper layer drain electrode 106*a* is formed so that the width thereof is narrower than that of the lower layer drain electrode 106*b*. The source electrode 105 and the drain electrode 106 are electrically connected to the oxide semiconductor layer at the bottoms of the contact holes 131 and 132, respectively. In this step, a signal line 152 is formed simultaneously.

Step (G1):

Next, as shown in FIG. 5(*f*), an interlayer insulating layer 108 of a photosensitive material is formed on the protecting layer 107 so as to cover the source electrode 105 and the drain electrode 106 by SOG technique utilizing a spin coater or a slit coater, for example. Thereafter, by photolithography and dry etching, the interlayer insulating layer 108 is patterned (the fifth mask process), thereby forming a contact hole (a third contact hole) 133 in the interlayer insulating layer 108.

Step (H1):

Next, on the interlayer insulating layer 108, a transparent conductive material is deposited by sputtering, for example. At this time, the transparent conductive material is deposited so as to be in contact with the drain electrode 106 in the contact hole 133. As the transparent conductive material, for example, ITO (the thickness: 50 to 200 nm) is used. Then, the transparent electrode layer is patterned by known photolithography (the sixth mask process). As a result, as shown in FIG. 5(*g*), a transparent electrode (a pixel electrode in a pixel 50) 109 is formed.

Next, with reference to FIG. 6, the production method of a counter substrate of the liquid crystal display device 1000 will be described.

Figure 6:
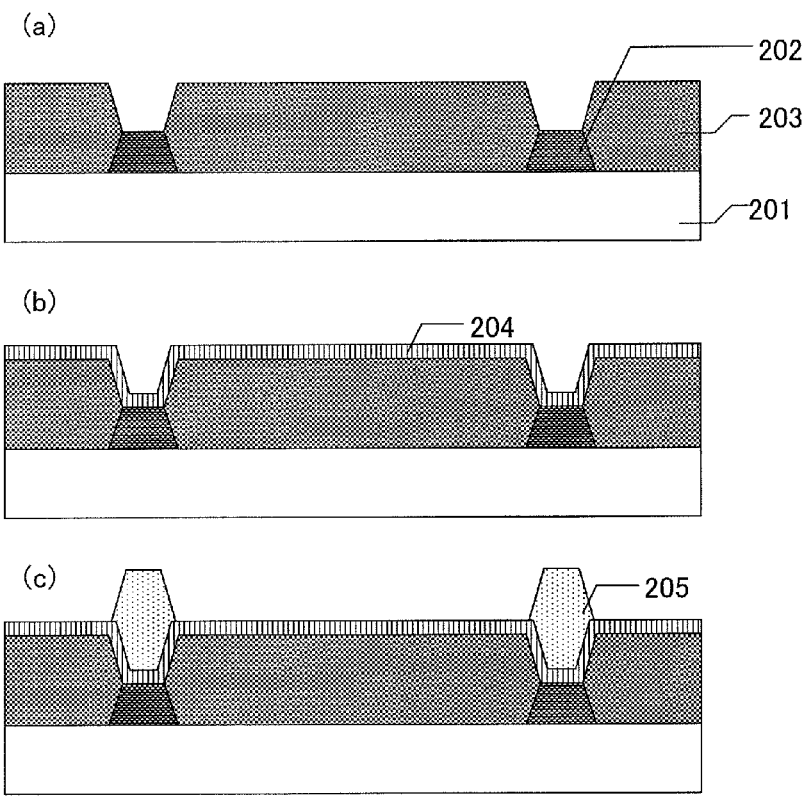
In FIG. 6, (a) to (c) are sectional views schematically showing the production process of a counter substrate 200 of the liquid crystal display device 1000.

In FIG. 6, (a) to (c) are sectional views schematically showing the production process steps of a counter substrate 200 in the liquid crystal display device 1000 shown in FIG. 2.

First, on a substrate 201 such as a glass substrate, as shown in FIG. 6(a), a black matrix (BM) 202 and color filters 203 are formed by photolithography. The black matrix 202 is formed in a lattice-like manner so as to cover the boundaries of the pixels 50. In a region surrounded by the black matrix 202, a color filter 203 of red, green, or blue is formed so as to cover each pixel.

Next, as shown in FIG. 6(b), a counter electrode 204 is formed on the black matrix 202 and the color filters 203. The counter electrode is obtained by depositing ITO to the thickness of 50 to 200 nm by sputtering, and then patterning it by photolithography and wet etching.

Next, a photosensitive material is applied on the counter electrode 204, and the material is patterned by photolithography, thereby forming a photo spacer 205 having a shape as shown in FIG. 6(c) above the black matrix 202.

Thereafter, the TFT substrate 100 and the counter substrate 200 which are formed as described above are stuck together with a liquid crystal layer interposed therebetween, thereby completing the liquid crystal display device 1000. Before the sticking, on respective surfaces on the sides of the electrodes of the TFT substrate 100 and the counter substrate 200 (i.e. on the sides of the liquid crystal layer), alignment films are formed. The alignment film is obtained by forming a film of polyimide by printing. Before the sticking, a sealing member is formed by printing in a fringe region of one of the substrates, and a liquid crystal material is dropped onto the area enclosed by the sealing member. In general, a plurality of TFT substrates 100 and a plurality of counter substrates 200 corresponding to a plurality of liquid crystal display devices 1000 are formed as a large TFT substrate and a large counter substrate. After the large substrates are stuck together, they are diced and separated, thereby obtaining a plurality of liquid crystal display device 100.

According to this embodiment, the protecting layer 107 is formed on the oxide semiconductor layer 104 by a spin-on-glass technique, so that the damage to the oxide semiconductor layer from the sputtering, the etching, the annealing, and other treatments during the formation of upper layers can be prevented or reduced. In addition, according to this embodiment, when the protecting layer 107 is formed, $H_2O$ or —OH radical are diffused from the SOG material to the oxide semiconductor layer. Thus, the defect of the oxide semiconductor can be restored. Moreover, according to this embodiment, the oxide semiconductor can be annealed by the sintering of the protecting layer 107, so that the production process steps can be simplified.

Next, other embodiments (Embodiments 2 to 13) according to the present invention will be described. Through these embodiments, the effects which are fundamentally obtained from the above-described embodiment can be obtained.

Embodiment 2

Next, with reference to FIG. 7 and FIG. 8, a semiconductor device 100b in Embodiment 2 of the present invention will be described.

Figure 7:
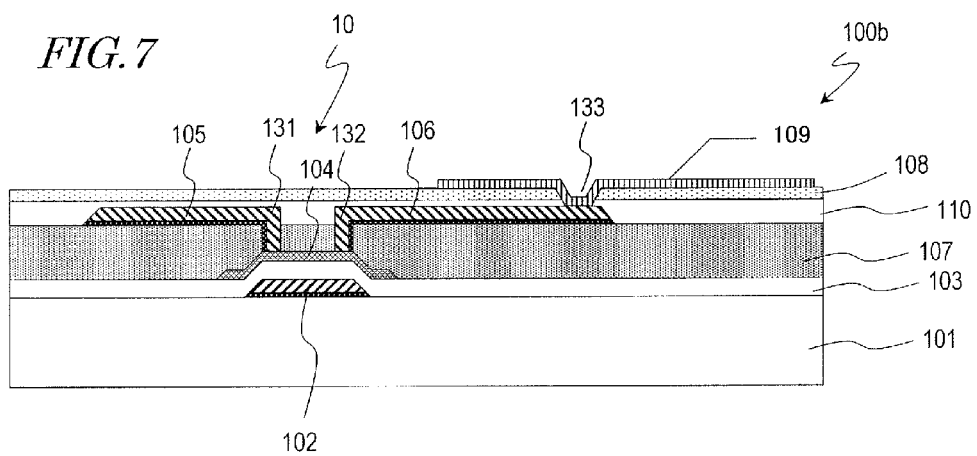
FIG. 7 is a sectional view showing the configuration of a semiconductor device 100b in Embodiment 2 of the present invention.

FIG. 7 is a sectional view schematically showing the configuration of the semiconductor device 100b. The fundamental configuration of the semiconductor device 100b except for the configuration which will be described below is the same as that of the semiconductor device 100 in Embodiment 1. The components having the same functions are designated by the same reference numerals, and the detailed descriptions thereof are omitted.

The semiconductor device 100b includes a gate electrode 102, a gate insulating layer 103, an oxide semiconductor layer 104, a protecting layer 107, a source electrode 105, a drain electrode 106, a protecting layer (a second protecting layer) 110, an interlayer insulating layer 109 and a transparent electrode 109, formed on a substrate 101. Unlike the semiconductor device 100 shown in FIG. 1, on the oxide semiconductor layer 104, the protecting layer 110 is provided so as to cover the source electrode 105 and the drain electrode 106, and an interlayer insulating layer 108 is formed on the protecting layer 110. A contact hole 133 is formed so as to reach the drain electrode 106 through the interlayer insulating layer 108 and the protecting layer 110.

Next, with reference to FIG. 8, the production method of the semiconductor device 100b will be described.

Figure 8:
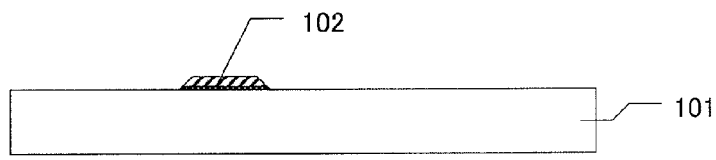
In FIG. 8, (a) to (g) are sectional views schematically showing the production process of the semiconductor device 100b.
Figure 8:
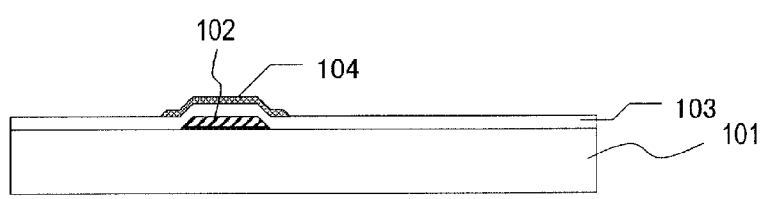
Figure 8:
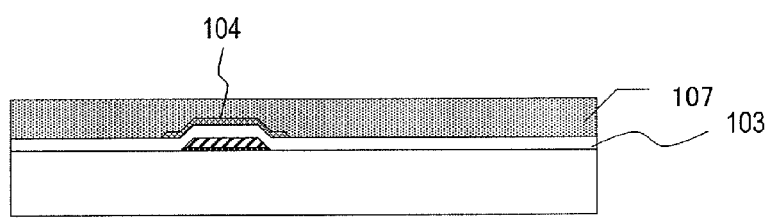
Figure 8:
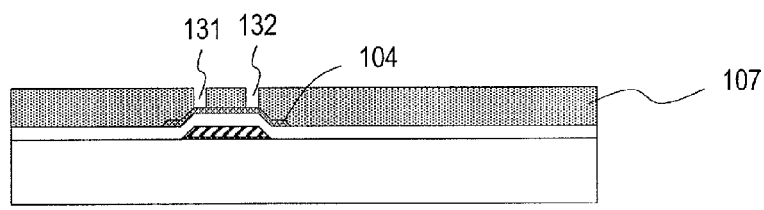
Figure 8:
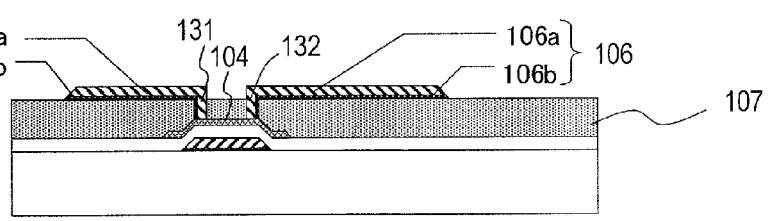
Figure 8:
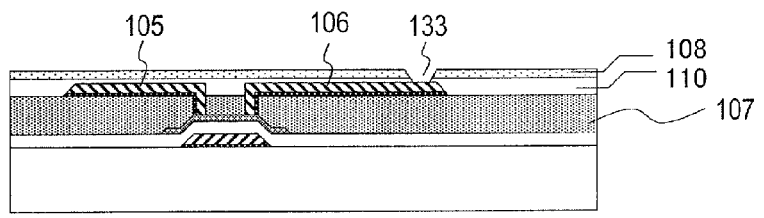
Figure 8:
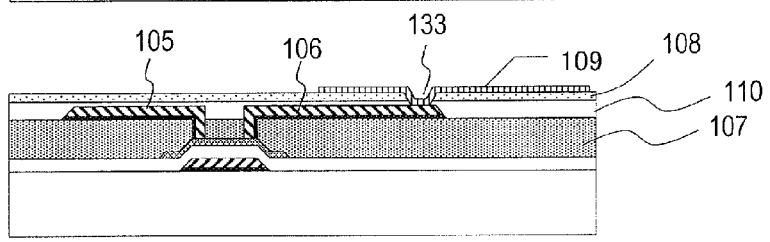

In FIG. 8, (a) to (g) are schematic sectional views showing the production process steps of the semiconductor device 100b.

First, as shown in (a) to (e) in FIG. 8, the same steps as the steps (A1) to (F1) described above with reference to FIG. 5 are performed, so that the gate electrode 102, the gate insulating layer 103, the oxide semiconductor layer 104, the protecting layer 107, the source electrode 105, and the drain electrode 106 are formed on the substrate 101.

Next, so as to cover the source electrode 105 and the drain electrode 106, on the protecting layer 107, an oxide layer is layered by CVD, thereby forming a protecting layer (a second protecting layer) 110. The thickness of the protecting layer 110 is 50 to 300 nm. As the material for the protecting layer 110, silicon dioxide ($SiO_2$) is used. Instead of the silicon dioxide, silicon nitride ($SiN_x$) may be used. Alternatively, a layered structure of a silicon dioxide layer and a silicon nitride layer can be applied to the protecting layer 110.

Next, an interlayer insulating layer 108 is formed on the protecting layer 110. Thereafter, the interlayer insulating layer 108 and the protecting layer 110 are patterned by photolithography and dry etching (the fifth mask process), thereby forming the contact hole 133 in the interlayer insulating layer 108 and the protecting layer 110, as shown in FIG. 8(f).

Thereafter, by the same method as in the above-described step (H1), a transparent electrode 109 is formed as shown in FIG. 8(g). The transparent electrode 109 is electrically connected to the drain electrode 106 via the contact hole 133.

Embodiment 3

Next, with reference to FIG. 9 and FIG. 10, a semiconductor device 100c in Embodiment 3 of the present invention will be described.

Figure 9:
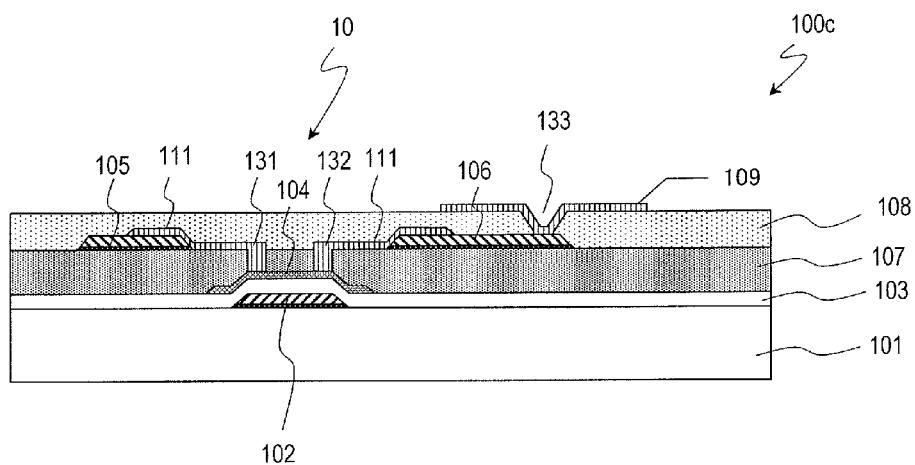
FIG. 9 is a sectional view showing the configuration of a semiconductor device 100c in Embodiment 3 of the present invention.

FIG. 9 is a sectional view schematically showing the configuration of the semiconductor device 100c. The fundamental configuration of the semiconductor device 100c except for the configuration which will be described below is the same as that of the semiconductor device 100 in Embodiment 1. The components having the same functions are designated by the same reference numerals, and the detailed descriptions thereof are omitted.

The semiconductor device 100c includes a gate electrode 102, a gate insulating layer 103, an oxide semiconductor layer 104, a protecting layer 107, a source electrode 105, a drain electrode 106, a transparent electrode (a second transparent electrode) 111, an interlayer insulating layer 108, and a transparent electrode 109, formed on a substrate 101. Unlike the semiconductor device 100 shown in FIG. 1, the source electrode 105 and the drain electrode 106 are formed in the positions slightly away from the contact holes 131 and 132, respectively, so as not to cover the contact holes 131 and 132.

On the contact holes 131 and 132, and on the protecting layer 107 around them, two transparent electrodes 111 which are separated from each other are formed. One of the transparent electrodes 111 buries the contact hole 131, and extends onto a part of the source electrode 105. With such a configuration, the source electrode 105 and the oxide semiconductor layer 104 are electrically connected via the transparent electrode 111. The other transparent electrode 111 buries the contact hole 132, and extends onto a part of the drain electrode 106. With such a configuration, the drain electrode 106 and the oxide semiconductor layer 104 are electrically connected via the transparent electrode 111.

Next, with reference to FIG. 10, the production method of the semiconductor device 100c will be described.

Figure 10:
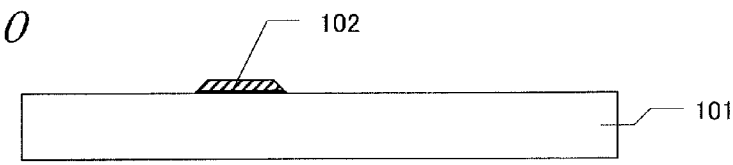
In FIG. 10, (a) to (g) are sectional views schematically showing the production process of the semiconductor device 100c.
Figure 10:
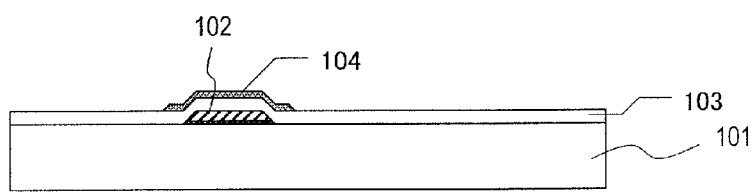
Figure 10:
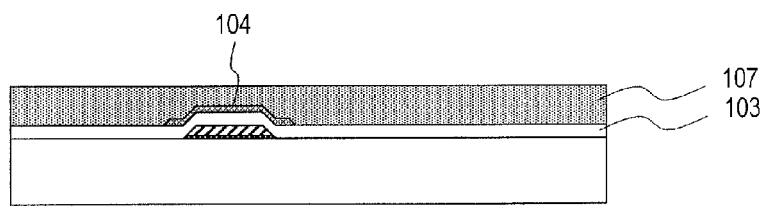
Figure 10:
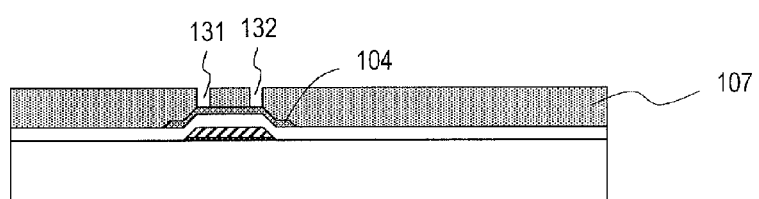
Figure 10:
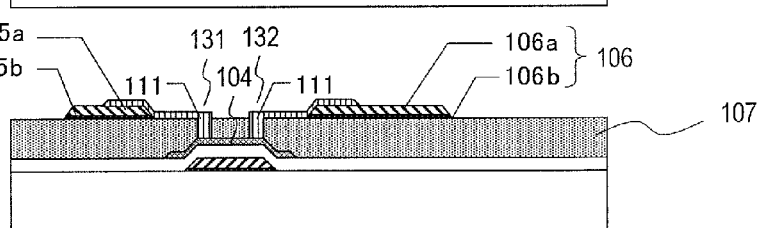
Figure 10:
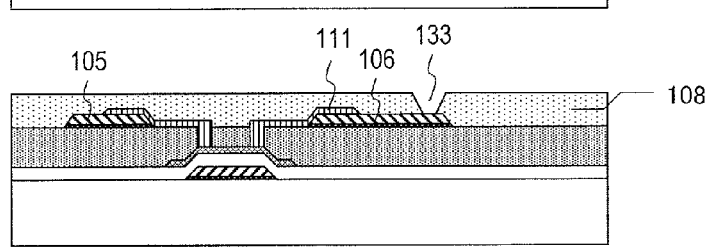
Figure 10:
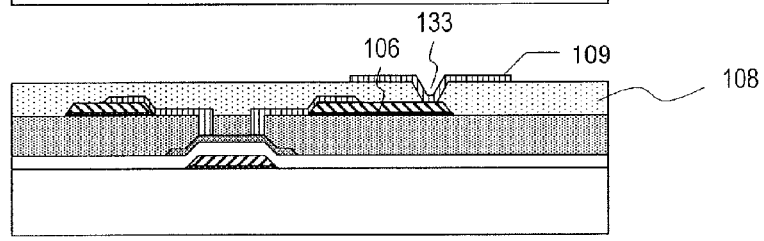

In FIG. 10, (a) to (g) are schematic sectional view showing the production process steps of the semiconductor device 100c.

First, as shown in (a) to (d) of FIG. 10, the same steps as the steps (A1) to (E1) which are described above with reference to FIG. 5 are performed, so that the gate electrode 102, the gate insulating layer 103, the oxide semiconductor layer 104, the protecting layer 107, and the contact holes 131 and 132 are formed on the substrate 101.

Next, similarly to the step (F1), by sputtering, on the protecting layer 107, Ti and Cu are layered in this order, and they are patterned by photolithography and wet etching, thereby obtaining the source electrode 105 and the drain electrode 106 (the fourth mask process). It is understood that, as shown in FIG. 10(e), the source electrode 105 and the drain electrode 106 are formed not in the positions which cover the contact holes 131 and 132, but in the positions away from the contact holes.

Next, by sputtering, ITO is deposited to the thickness of 50 to 200 nm. Thereafter, the ITO is patterned by photolithography and wet etching, so as to be left only in the positions in the vicinities of the contact holes 131 and 132 (the fifth mask process), thereby obtaining two transparent electrodes 111 which are separated from each other.

Thereafter, the same step as the step (G1) is performed, thereby forming the interlayer insulating layer 108 having the contact hole 133, as shown in FIG. 10(f) (the sixth mask process).

Next, the same step as the step (H1) is performed (the seventh mask process), thereby forming the transparent electrode 109 as shown in FIG. 10(g).

Embodiment 4

Next, with reference to FIG. 11 and FIG. 12, a semiconductor device 100d in Embodiment 4 of the present invention will be described.

Figure 11:
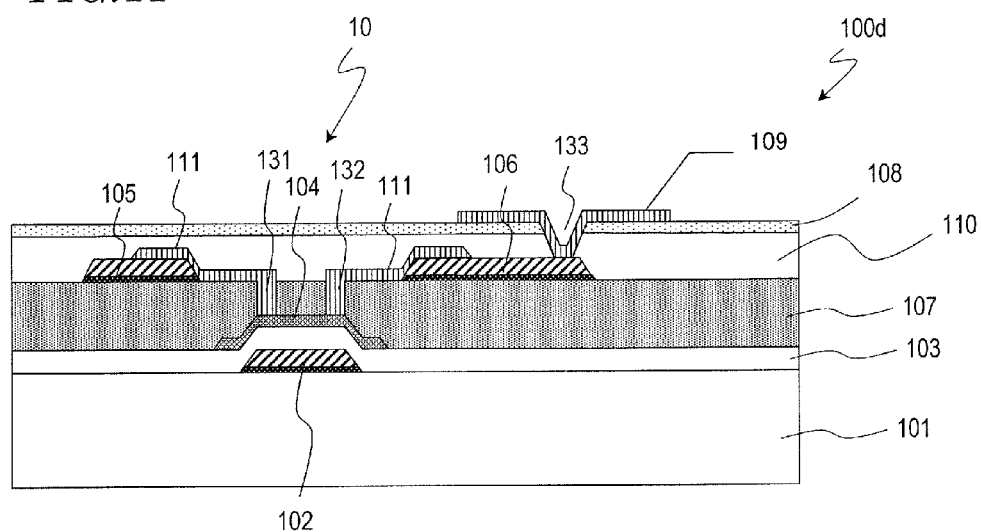
FIG. 11 is a sectional view showing the configuration of a semiconductor device 100d in Embodiment 4 of the present invention.

FIG. 11 is a sectional view schematically showing the configuration of the semiconductor device 100d. The fundamental configuration of the semiconductor device 100d except for the configuration which will be described below is the same as that of the semiconductor device 100c in Embodiment 3. The components having the same functions are designated by the same reference numerals, and the detailed descriptions thereof are omitted.

The semiconductor device 100d includes a gate electrode 102, a gate insulating layer 103, an oxide semiconductor layer 104, a protecting layer 107, a source electrode 105, a drain electrode 106, a transparent electrode 111, a protecting layer (a second protecting layer) 110, an interlayer insulating layer 108, and a transparent electrode 109, formed on a substrate 101. Unlike the semiconductor device 100c in Embodiment 3, on the oxide semiconductor layer 104, so as to cover the source electrode 105, the drain electrode 106, and the transparent electrode 111, the protecting layer 110 is provided, and the interlayer insulating layer 108 is formed on the protecting layer 110. A contact hole 133 is formed so as to reach the drain electrode 106 through the interlayer insulting layer 108 and the protecting layer 110.

Next, with reference to FIG. 12, the production method of the semiconductor device 100d will be described.

Figure 12:
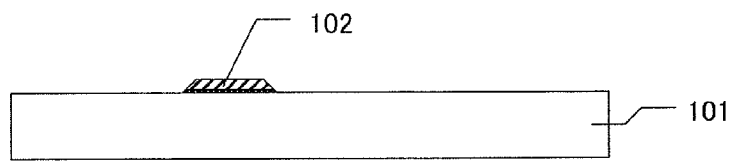
In FIG. 12, (a) to (g) are sectional views schematically showing the production process of the semiconductor device 100d.
Figure 12:
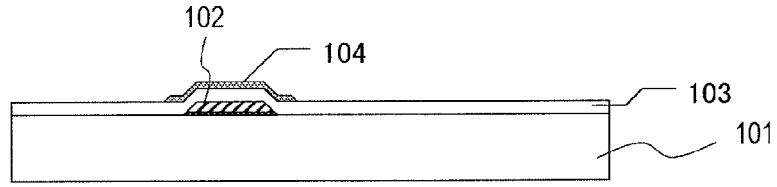
Figure 12:
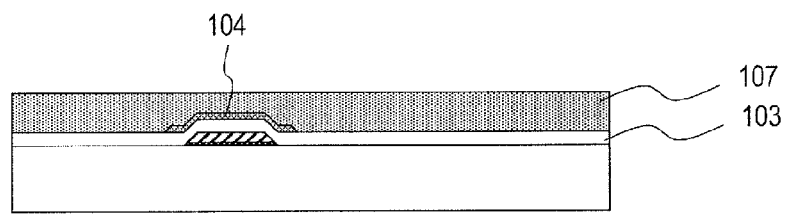
Figure 12:
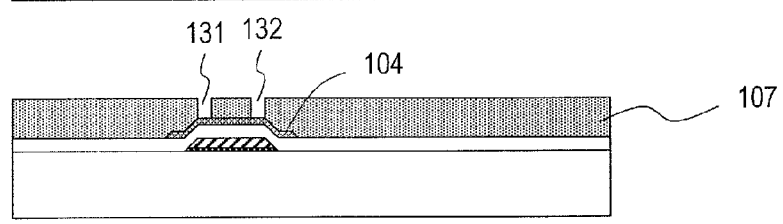
Figure 12:
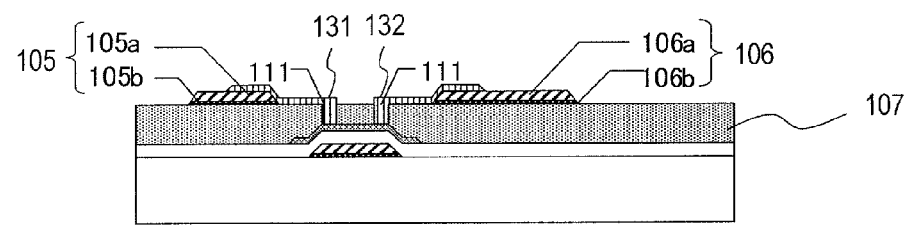
Figure 12:
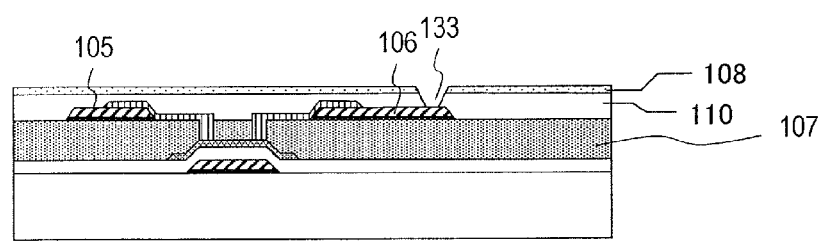
Figure 12:
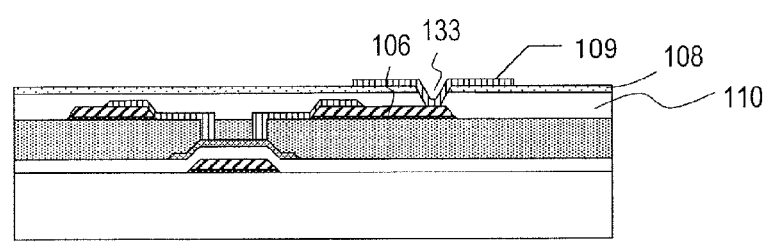

In FIG. 12, (a) to (g) are schematic sectional views showing the production process steps of the semiconductor device 100d.

First, as shown in (a) to (e) in FIG. 12, the same steps as the steps (a) to (e) in FIG. 10 are performed, so that on the substrate 101, the gate electrode 102, the gate insulating layer 103, the oxide semiconductor layer 104, the protecting layer 107, the source electrode 105, the drain electrode 106, and the transparent electrode 111 are formed.

Next, so as to cover the source electrode 105, the drain electrode 106, and the transparent electrode 111, an oxide layer is layered by CVD on the protecting layer 107, thereby forming the protecting layer (a second protecting layer) 110.

Next, the interlayer insulating layer 108 is formed on the protecting layer 110. Thereafter, the interlayer insulating layer 108 and the protecting layer 110 are patterned by photolithography and dry etching (the sixth mask process), thereby forming the contact hole 133 in the interlayer insulating layer 108 and the protecting layer 110, as shown in FIG. 12(f).

Thereafter, by the same method as in the above-described step (H1), the transparent electrode 109 is formed as shown in FIG. 12(g). The transparent electrode 109 is electrically connected to the drain electrode 106 via the contact hole 133.

Embodiment 5

Next, with reference to FIG. 13 and FIG. 14, a semiconductor device 100e in Embodiment 5 of the present invention will be described.

Figure 13:
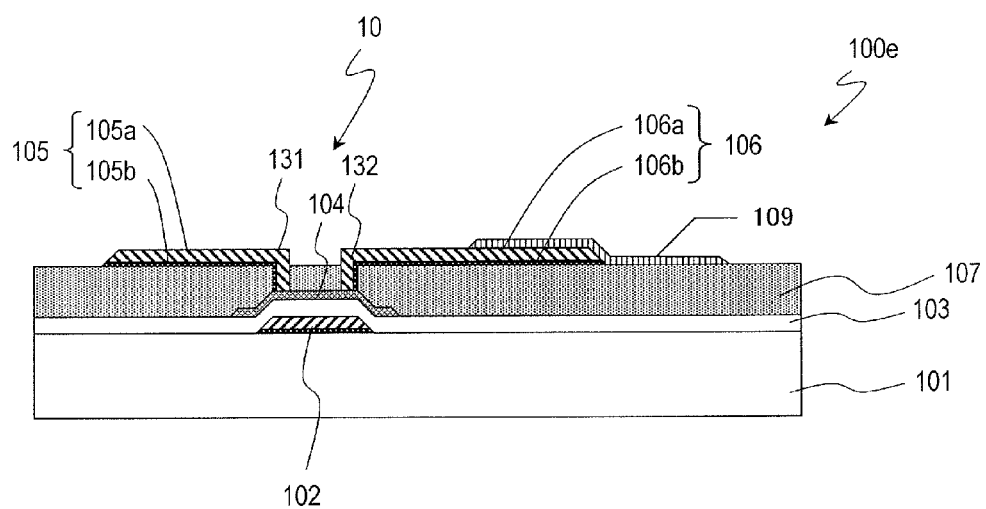
FIG. 13 is a sectional view showing the configuration of a semiconductor device 100e in Embodiment 5 of the present invention.

FIG. 13 is a sectional view schematically showing the configuration of the semiconductor device 100e. The fundamental configuration of the semiconductor device 100e except for the configuration which will be described below is the same as that of the semiconductor device 100 in Embodiment 1. The components having the same functions are designated by the same reference numerals, and the detailed descriptions thereof are omitted.

The semiconductor device 100e includes a gate electrode 102, a gate insulating layer 103, an oxide semiconductor layer 104, a protecting layer 107, a source electrode 105, a drain electrode 106, and a transparent electrode 109, formed on a substrate 101. Unlike the semiconductor device 100 shown in FIG. 1, the interlayer insulating layer 108 is not formed, and the transparent electrode 109 is formed so as to be directly in contact with the drain electrode 106 and the protecting layer 107.

Next, with reference to FIG. 14, the production method of the semiconductor device 100e will be described.

Figure 14:
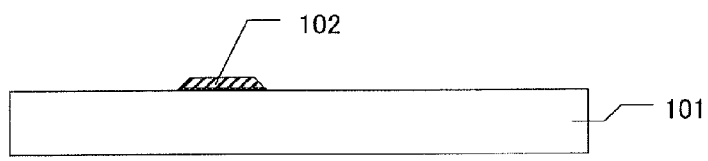
In FIG. 14, (a) to (f) are sectional views schematically showing the production process of the semiconductor device 100e.
Figure 14:
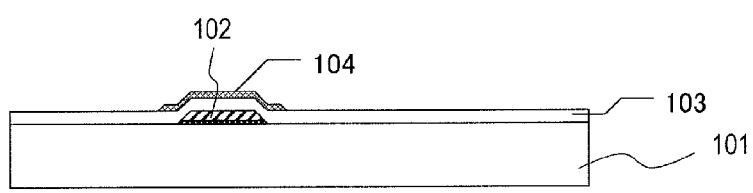
Figure 14:
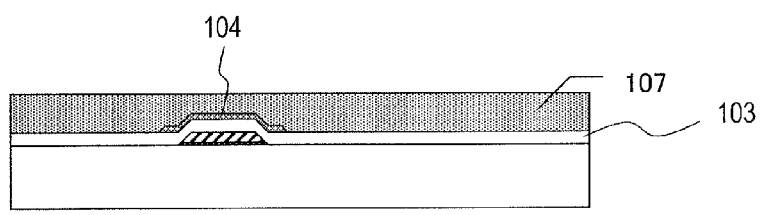
Figure 14:
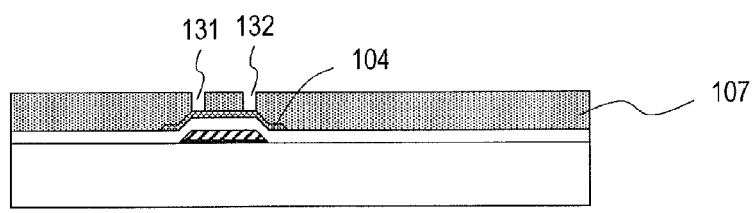
Figure 14:
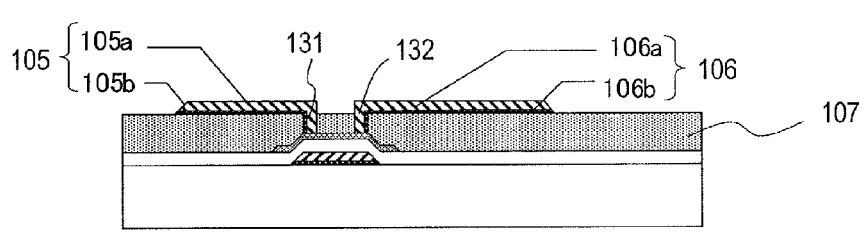
Figure 14:
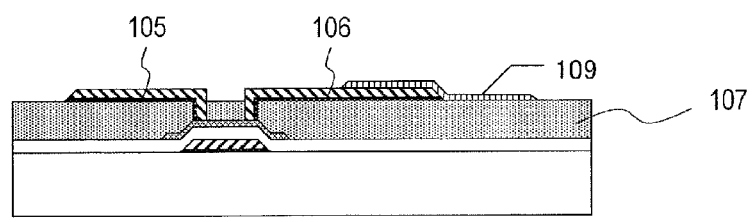

In FIG. 14, (a) to (f) are schematic sectional views showing the production process steps of the semiconductor device 100e.

As shown in (a) to (e) in FIG. 14, the same steps as the steps (A1) to (F1) described above with reference to FIG. 5 are performed, so that the gate electrode 102, the gate insulating layer 103, the oxide semiconductor layer 104, the protecting layer 107, contact holes 131 and 132, the source electrode 105, and the drain electrode 106 are formed on the substrate 101.

Next, without forming the interlayer insulating layer 108, the same step as the step (H1) is performed (the fifth mask process), thereby forming the transparent electrode 109 which is directly in contact with the drain electrode 106 on the protecting layer 107.

Embodiment 6

Next, with reference to FIG. 15 and FIG. 16, a semiconductor device 100f in Embodiment 6 of the present invention will be described.

Figure 15:
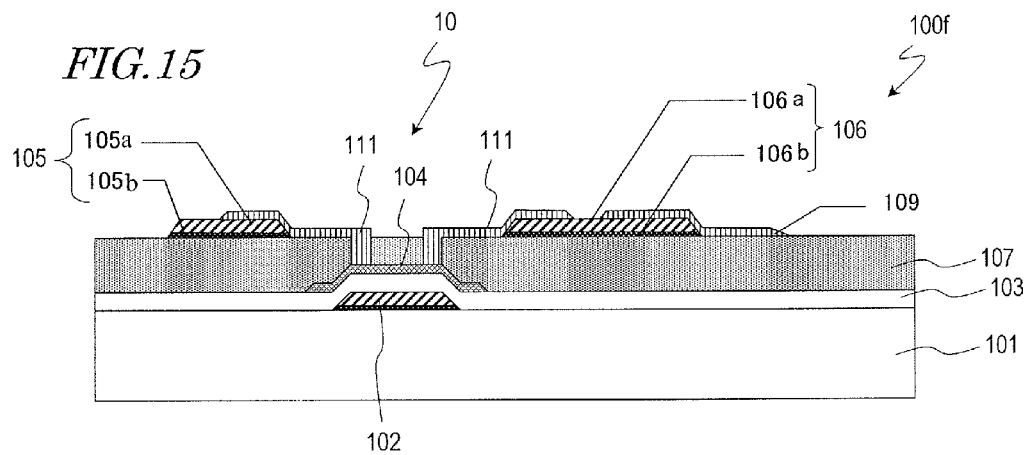
FIG. 15 is a sectional view showing the configuration of a semiconductor device 100f in Embodiment 6 of the present invention.

FIG. 15 is a sectional view schematically showing the configuration of the semiconductor device 100f. The fundamental configuration of the semiconductor device 100f except for the configuration which will be described below is the same as that of the semiconductor device 100c in Embodiment 3. The components having the same functions are designated by the same reference numerals, and the detailed descriptions thereof are omitted.

The semiconductor device 100f includes a gate electrode 102, a gate insulating layer 103, an oxide semiconductor layer 104, a protecting layer 107, a source electrode 105, a drain electrode 106, and a transparent electrode 109, formed on a substrate 101. Unlike the semiconductor device 100c in Embodiment 3, the interlayer insulating layer 108 is not formed, and the transparent electrode 109 is formed so as to be directly in contact with the drain electrode 106 and the protecting layer 107. A transparent electrode 111 is formed via the same process and from the same material as those for the transparent electrode 109.

Next, with reference to FIG. 16, the production method of the semiconductor device 100f will be described.

Figure 16:
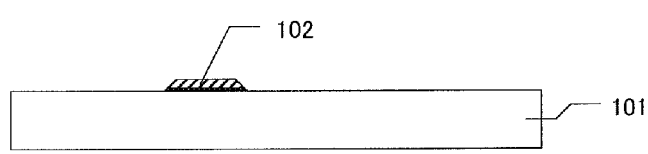
In FIG. 16, (a) to (e) are sectional views schematically showing the production process of the semiconductor device 100f.
Figure 16:
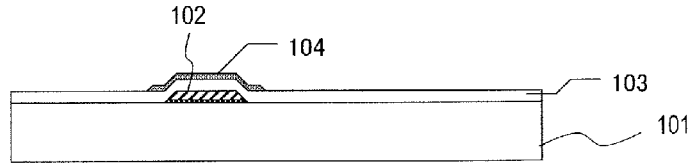
Figure 16:
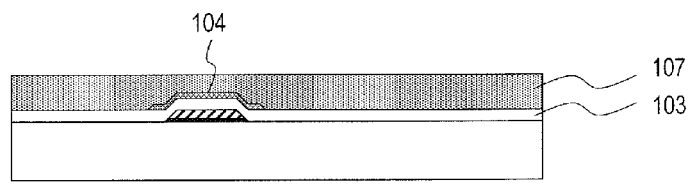
Figure 16:
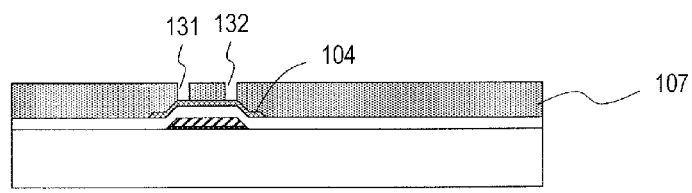
Figure 16:
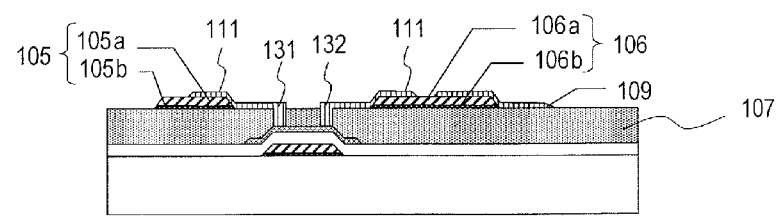

In FIG. 16, (a) to (e) are schematic sectional views showing the production process steps of the semiconductor device 100f.

As shown in (a) to (d) in FIG. 16, the same steps as those shown in (a) to (d) in FIG. 10 are performed, so that the gate electrode 102, the gate insulating layer 103, the oxide semiconductor layer 104, the protecting layer 107, and the contact holes 131 and 132 are formed on the substrate 101.

Next, without forming the interlayer insulating layer 108, the same step as that in FIG. 10(e) is performed (the fifth and sixth mask processes), thereby forming the source electrode 105, the drain electrode 106, and the transparent electrode 111, as shown in FIG. 16(e). In this step, simultaneously with the transparent electrode 111, the transparent electrode 109 is formed so as to be directly in contact with the drain electrode 106.

Embodiment 7

Next, with reference to FIG. 17 and FIG. 18, a semiconductor device 100g in Embodiment 7 of the present invention will be described.

The semiconductor device 100g is a semiconductor device obtained as a TFT substrate of the liquid crystal display device 1000. The semiconductor device 100g includes a TFT portion 60 including a TFT 10, a Cs portion 70 including a pixel electrode 109 and a storage capacitor, and a terminal portion 30.

Figure 17:
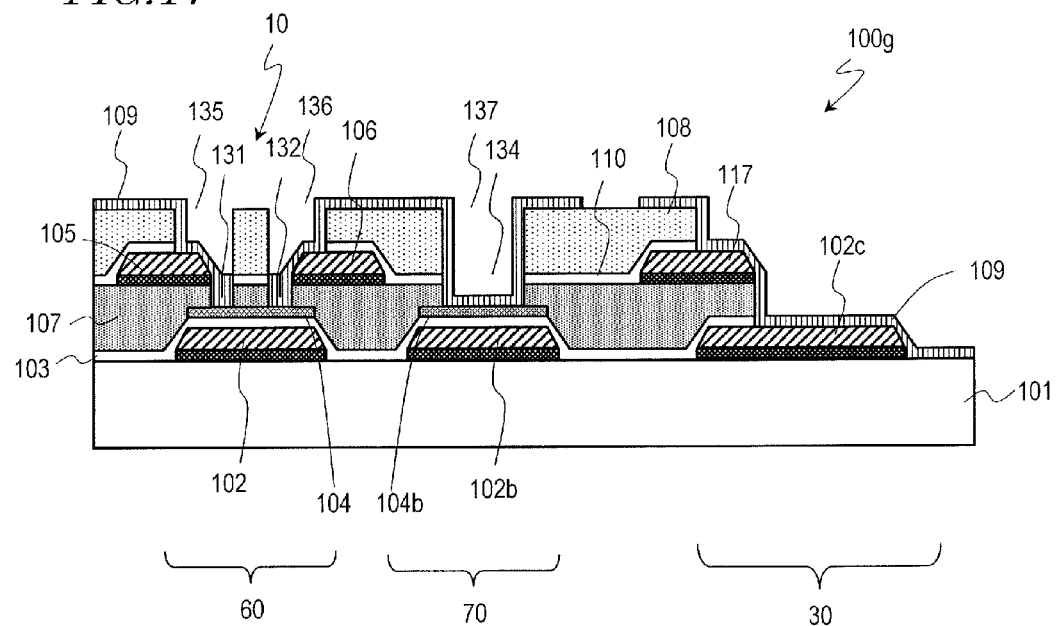
FIG. 17 is a sectional view showing the configuration of a semiconductor device 100g in Embodiment 7 of the present invention.

FIG. 17 is a sectional view schematically showing the configurations of the TFT portion 60, the Cs portion 70, and the terminal portion 30 in the semiconductor device 100g. The fundamental configuration of the semiconductor device 100g except for the configuration which will be described below is the same as that of the semiconductor device 100 in Embodiment 1. The components having the same functions are designated by the same reference numerals, and the detailed descriptions thereof are omitted.

The TFT portion 60 in the semiconductor device 100g includes a gate electrode 102, a gate insulating layer 103, an oxide semiconductor layer 104, a protecting layer 107, a source electrode 105, a drain electrode 106, a protecting layer 110, an interlayer insulating layer 108, and a transparent electrode 109, formed on a substrate 101.

In the protecting layer 107, contact holes 131 and 132 are formed. In the interlayer insulating layer 108 and the protecting layer 110 on the contact hole 131 and part of the source electrode 105, a contact hole 135 is formed. In the interlayer insulating layer 108 and the protecting layer 110 on the contact hole 132 and part of the drain electrode 106, another contact hole 136 is formed. The transparent electrode 109 is formed so as to cover the upper surface of the interlayer insulating layer 108, the side faces of the contact holes 135 and 136, part of the source electrode 105, and part of the drain electrode 106, and to bury the contact holes 131 and 132. By means of a part of the transparent electrode 109, via the contact hole 131, the source electrode 105 and the oxide semiconductor layer 104 in the TFT portion 60 are electrically connected. By means of another part of the transparent electrode 109, via the contact hole 132, the drain electrode 106 and the oxide semiconductor layer 104 are electrically connected.

The Cs portion 70 in the semiconductor device 100g includes a storage capacitor electrode (a Cs electrode) 102b, the gate insulating layer 103, an oxide semiconductor layer 104b, the protecting layer 107, the protecting layer 110, the interlayer insulating layer 108, and the transparent electrode (the pixel electrode) 109, formed on the substrate 101. The gate insulating layer 103 is formed on the substrate 101 so as to cover the storage capacitor electrode 102b. The oxide semiconductor layer 104b is formed above the storage capacitor electrode 102b with the gate insulating layer 103 sandwiched therebetween. The oxide semiconductor layer 104b functions as a storage capacitor counter electrode. A storage capacitor is constituted by the storage capacitor electrode 102b and the storage capacitor counter electrode, and the gate insulating layer 103 sandwiched between the electrodes.

In the protecting layer 107, a contact hole (a third contact hole) 134 is formed. In the interlayer insulating layer 108 and the protecting layer 110 on the contact hole 134, a contact hole 137 is formed. The transparent electrode 109 is formed so as to cover the upper surface of the interlayer insulating layer 108, the side face of the contact hole 137, and the bottom portion of the contact hole 134. In the bottom of the contact hole 134, the transparent electrode 109 is connected to the oxide semiconductor layer 104b.

The terminal portion 30 of the semiconductor device 100g includes a lower layer wiring 102c, the gate insulating layer 103, the protecting layer 107, an upper layer wiring 117, the protecting layer 110, the interlayer insulating layer 108, and the transparent electrode 109, formed on the substrate 101. The gate insulating layer 103 and the protecting layer 107 are formed only on part of the lower layer wiring 102c. The protecting layer 110 and the interlayer insulating layer 108 are formed only on part of the upper layer wiring 117. A portion of the lower layer wiring 102c which is not covered with the gate insulating layer 103 and the protecting layer 107, the side faces of the gate insulating layer 103 and the protecting layer 107, a portion of the upper layer wiring 117 which is not covered with the protecting layer 110 and the interlayer insulating layer 108, the side faces of the protecting layer 110 and the interlayer insulating layer 108, and the upper surface of the interlayer insulating layer 108 are covered with the transparent electrode 109. By the transparent electrode 109, the upper layer wiring 117 and the lower layer wiring 102c are electrically connected.

Next, with reference to FIG. 18, the production method of the semiconductor device 100g will be described.

Figure 18:
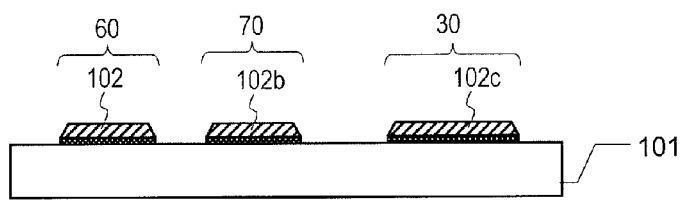
In FIG. 18, (a) to (g) are sectional views schematically showing the production process of the semiconductor device 100g.
Figure 18:
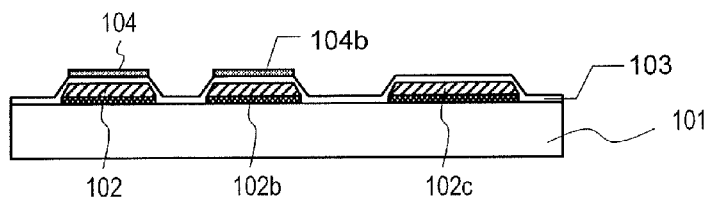
Figure 18:
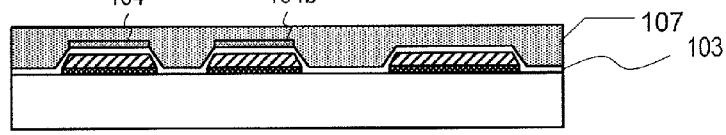
Figure 18:
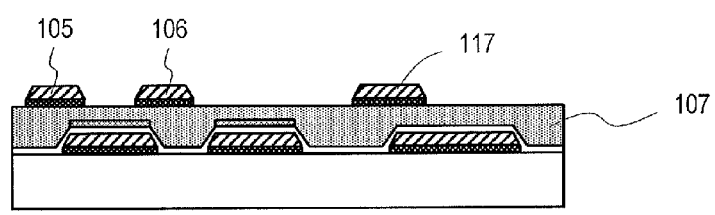
Figure 18:
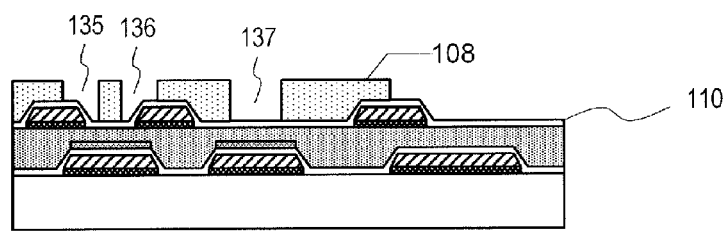
Figure 18:
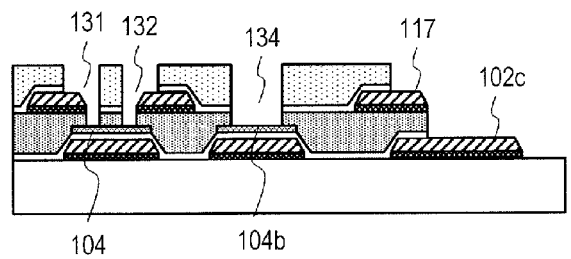
Figure 18:
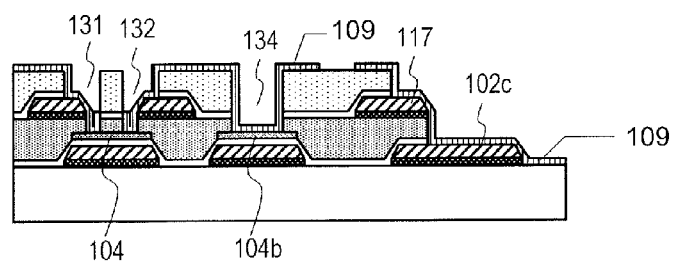

In FIG. 18, (a) to (g) are schematic sectional views showing the production process steps of the semiconductor device 100g.

Step (A2):

First, on the substrate 101, a Ti layer and a Cu layer are layered in this order by sputtering or the like. The thickness of the Ti layer is 30 to 150 nm, and the thickness of the Cu layer is 200 to 500 nm. Next, these two layers are patterned by known photolithography and wet etching (the first mask process), thereby obtaining the gate electrode 102, the storage capacitor electrode 102b, and the lower layer wiring 102c, as shown in FIG. 18(a). At this time, a scanning line 160 and a storage capacitor line which are not shown are simultaneously formed. Thereafter, the remaining resist is peeled off and the substrate is cleaned.

Step (B2-1):

Next, on the substrate 101, the gate insulating layer 103 is formed so as to cover the gate electrode 102, the storage capacitor electrode 102b, and the lower layer wiring 102c. The gate insulating layer 103 has a two layer structure of a silicon nitride (SiNx) film layered by CVD to the thickness of 100 to 500 nm and a silicon oxide (SiO$_2$) film layered thereon by CVD to the thickness of 10 to 200 nm. Alternatively, the gate insulating layer 103 may be a single layer film of silicon nitride or silicon oxide.

Step (B2-2):

Next, an oxide semiconductor is layered on the gate insulating layer 103. The oxide semiconductor is formed by layering e.g. IGZO by sputtering to the thickness of 10 to 100 nm. Thereafter, the layered oxide semiconductor is patterned by photolithography and wet etching (the second mask process), thereby obtaining the oxide semiconductor layer 104 as the channel layer of the TFT and the storage capacitor electrode 102b of the Cs portion 70, as shown in FIG. 18(b). Thereafter, the remaining resist is peeled off and the substrate is cleaned. As the oxide semiconductor, instead of IGZO, another kind of oxide semiconductor film may be used.

Step (B2-3):

Next, as shown in FIG. 18(c), on the gate insulating layer 103, an SOG material is applied by spin coating so as to cover the oxide semiconductor layer 104 and the storage capacitor electrode 102b, and the applied SOG material is sintered. The sintering temperature is 200 to 450 degrees. In this embodiment, the sintering is performed at 350 degrees. As the result of the sintering, dehydration polymerization reaction of the SOG material is caused, thereby forming the protecting layer 107 of silicon oxide having the thickness of 100 to 3000 nm (the formation of the protecting layer 107 by SOG technique).

Step (C2):

Next, by sputtering, on the protecting layer 107, Ti and Cu are layered in this order. The thickness of the Ti layer is 20 to 150 nm, and the thickness of the Cu layer is 100 to 600 nm. Next, the two layers of Cu/Ti are patterned by photolithography and wet etching, thereby obtaining the source electrode 105, the drain electrode 106, and the upper layer wiring 117 of the terminal portion 30, as shown in FIG. 18(d) (the third mask process). Thereafter, the remaining resist is removed, and the substrate is cleaned.

In each of the source electrode 105, the drain electrode 106, and the upper layer wiring, the width of the Cu layer as the upper layer is formed so as to be narrower than that of the Ti layer as the lower layer. In this process step, a signal line 152 shown in FIG. 4 is simultaneously formed.

Step (D2-1):

Next, so as to cover the source electrode 105, the drain electrode 106, and the upper layer wiring 117, on the protecting layer 107, an oxide layer is layered by CVD, thereby forming the protecting layer (the second protecting layer) 110. The thickness of the protecting layer 110 is 50 to 300 nm.

Next, on the protecting layer 110, the interlayer insulating layer 108 of a photosensitive material is formed. Thereafter, the interlayer insulating layer 108 is patterned by photolithography and dry etching (the fourth mask process), thereby forming contact holes 135 to 137 in the interlayer insulating layer 108 as shown in FIG. 18(e). At this time, in the terminal portion 30, the interlayer insulating layer 108 on the lower layer wiring 102c, and on part of the upper layer wiring 117 is removed.

Step (D2-2):

Next, as shown in FIG. 18(f), by using the interlayer insulating layer 108 as a mask, dry etching is performed, thereby forming the contact holes 131, 132, and 134 in the protecting layers 110 and 107 at the bottoms of the contact holes 135 to 137. At the bottoms of the contact holes 131 and 132, the oxide semiconductor layer 104 is exposed, and at the bottom of the contact hole 134, the oxide semiconductor layer 104b is exposed. At this time, in the terminal portion 30, the gate insulating layer 103, the protecting layer 107, and the protecting layer 110 on the lower layer wiring 102c, and the protecting layer 110 on part of the upper layer wiring 117 are also removed.

Step (E2):

Next, on the interlayer insulating layer 108, a transparent conductive material is deposited to the thickness of 50 to 200 nm by sputtering, for example. As the transparent conductive material, ITO is used, for example. At this time, the transparent conductive material is also deposited on the side faces of the contact holes 135 to 137, the side faces and the bottom faces of the contact holes 131, 132 and 134, and the exposed surface of the terminal portion 30. Then, by known photolithography, the transparent electrode layer is patterned (the fifth mask process). Accordingly, the transparent electrode 109 is formed as shown in FIG. 18(g).

By the transparent electrode 109 in the contact holes 131 and 135, the source electrode 105 and the oxide semiconductor layer 104 are electrically connected. By the transparent electrode 109 in the contact holes 132 and 136, the drain electrode 106 and the oxide semiconductor layer 104 are electrically connected. At the bottom of the contact hole 134, the transparent electrode 109 in the Cs portion 70 is electrically connected to the oxide semiconductor layer 104b. In the terminal portion 30, by the transparent electrode 109, the upper layer wiring 117 and the lower layer wiring 102c are electrically connected.

According to this embodiment, the effects by the protecting layer 107 described above in Embodiment 1 can be attained, and the TFT substrate for a display device including the TFT portion 60, the Cs portion 70, and the terminal portion 30 can be formed by five mask processes. Accordingly, the production efficiency of the display device can be improved, and the cost can be reduced. In the case where the TFT substrate includes a connecting portion for connecting the upper layer wiring 117 and the lower layer wiring 102c, the structure of the connecting portion and the production method thereof are the same as those of the terminal portion 30. The TFT substrate or the semiconductor device having such a connecting portion is also included in this embodiment and embodiments which are described below.

Embodiment 8

Next, with reference to FIG. 19 and FIG. 20, a semiconductor device 100h in Embodiment 8 of the present invention will be described.

Figure 19:
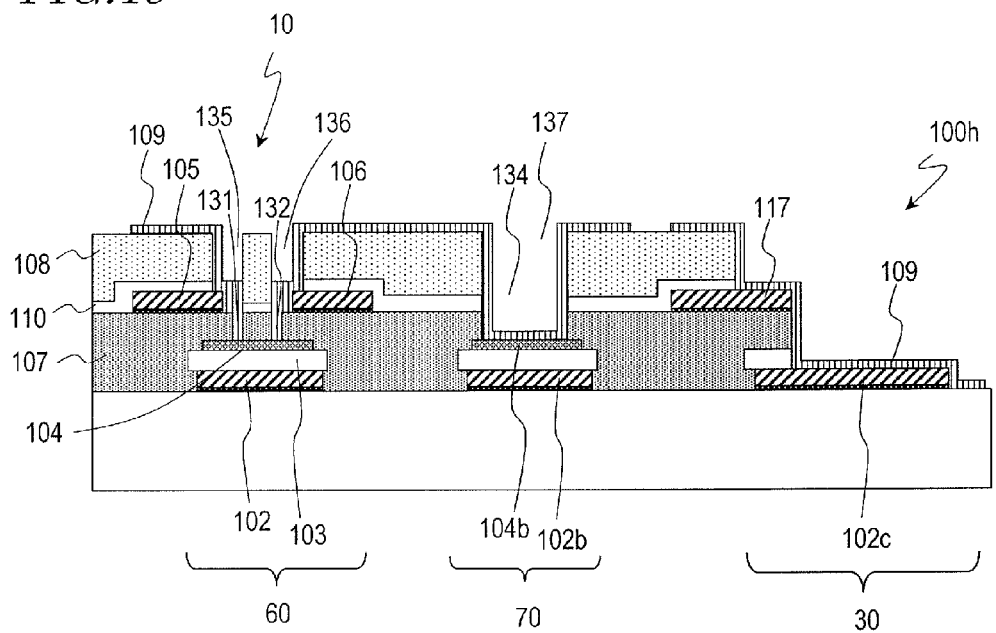
FIG. 19 is a sectional view showing the configuration of a semiconductor device 100h in Embodiment 8 of the present invention.

FIG. 19 is a sectional view schematically showing the configuration of the semiconductor device 100h. The fundamental configuration of the semiconductor device 100h except for the configuration which will be described below is the same as that of the semiconductor device 100g in Embodiment 7. The components having the same functions are designated by the same reference numerals, and the detailed descriptions thereof are omitted.

The TFT portion 60 of the semiconductor device 100h includes a gate electrode 102, a gate insulating layer 103, an oxide semiconductor layer 104, a protecting layer 107, a source electrode 105, a drain electrode 106, a protecting layer 110, an interlayer insulating layer 108, and a transparent electrode 109, formed on a substrate 101. Unlike Embodiment 7, the gate insulating layer 103 is substantially formed only between the gate electrode 102 and the oxide semiconductor layer 104.

The Cs portion 70 includes a storage capacitor electrode 102b, the gate insulating layer 103, an oxide semiconductor layer 104b, the protecting layer 107, the protecting layer 110, the interlayer insulating layer 108, and the transparent electrode 109, formed on the substrate 101. The gate insulating layer 103 is substantially formed only between the storage capacitor electrode 102b and the oxide semiconductor layer 104b.

The terminal portion 30 includes a lower layer wiring 102c, the gate insulating layer 103, the protecting layer 107, an upper layer wiring 117, the protecting layer 110, the interlayer insulating layer 108, and the transparent electrode 109, formed on the substrate 101. The gate insulating layer 103 is substantially formed only on part of the lower layer wiring 102c.

Next, with reference to FIG. 20, the production method of the semiconductor device 100h will be described.

Figure 20:
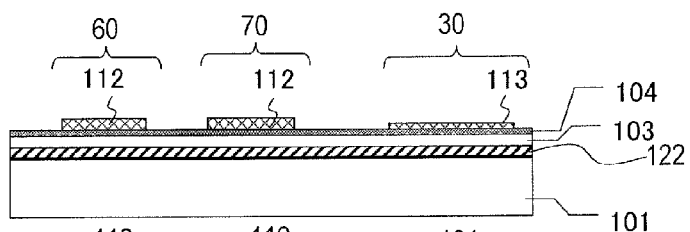
In FIG. 20, (a) to (h) are sectional views schematically showing the production process of the semiconductor device 100h.
Figure 20:
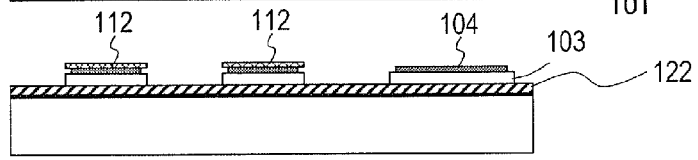
Figure 20:
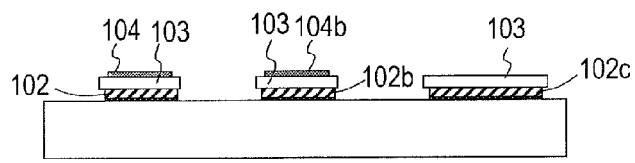
Figure 20:
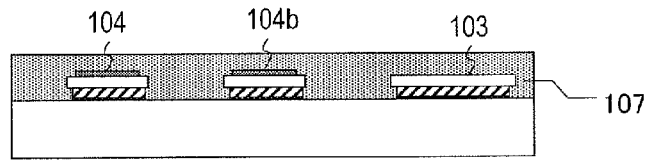
Figure 20:
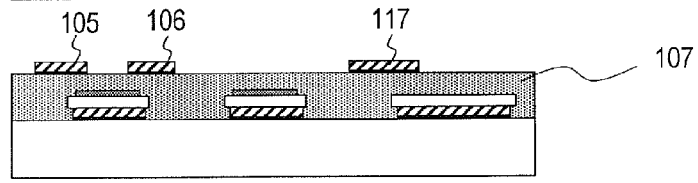
Figure 20:
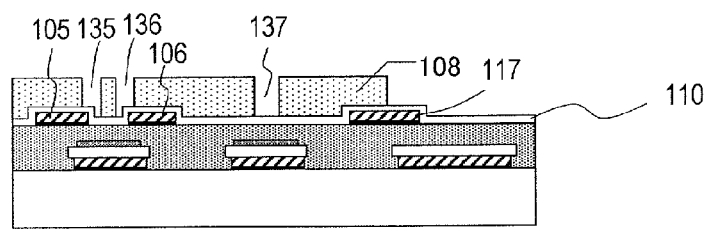
Figure 20:
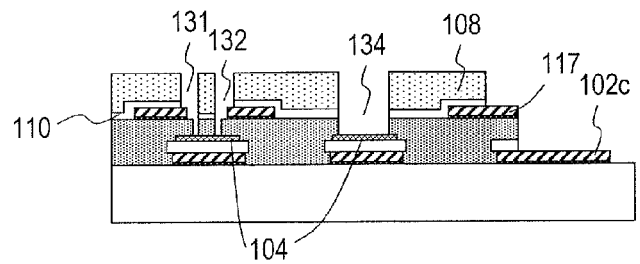
Figure 20:
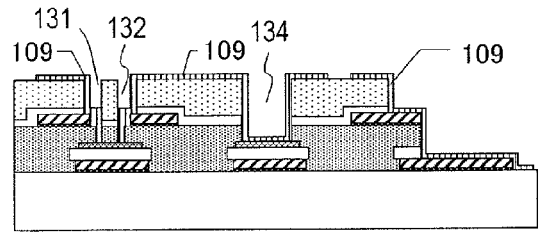

In FIG. 20, (a) to (h) are schematic sectional views showing the production process steps of the semiconductor device 100h.

First, by sputtering or the like, on the substrate 101, a Ti layer and a Cu layer are layered in this order, thereby obtaining a metal layer 122 of two layer configuration. The thickness of the Ti layer is 30 to 150 nm, and the thickness of the Cu layer is 200 to 500 nm. In addition, on the metal layer 122, the gate insulating layer 103 and the oxide semiconductor layer 104 are layered by the same method as that in Embodiment 7. Next, on the oxide semiconductor layer 104, e.g. a photosensitive resist is applied. The applied resist is selectively removed, thereby forming a resist 112 in the TFT portion 60 and the Cs portion 70, and a resist 113 in the terminal portion 30, as shown in FIG. 20(a). The resist 113 is formed so as to be thinner than the resist 112 by half-tone exposure or gray-tone exposure.

Next, by using the resists 112 and 113 as masks, wet etching is performed to the gate insulating layer 103 and the oxide semiconductor layer 104, thereby obtaining a layered structure shown in FIG. 20(b). Herein, in the TFT portion 60 and the Cs portion 70, on the metal layer 122, the gate insulating layer 103, the oxide semiconductor layer 104, and the resist 112 are left in an island-like shape. In the terminal portion 30, the gate insulating layer 103 and the oxide semiconductor layer 104 are left in an island-like shape.

Next, dry etching is performed so as to pattern the metal layer 112, and then the resist 112 is removed. As a result, as shown in FIG. 20(c), in the TFT portion 60, an island-like structure including the gate electrode 102, the gate insulating layer 103, and the oxide semiconductor layer 104 is formed. In the Cs portion 70, an island-like structure including the storage capacitor electrode 102b, the gate insulating layer 103, and the oxide semiconductor layer 104b is formed. In the terminal portion 30, an island-like structure including the lower layer wiring 102c and the gate insulating layer 103 is formed.

Next, as shown in (d) to (h) in FIG. 20, the same method as that shown in (c) to (h) of FIG. 18 in Embodiment 7 is performed, thereby completing the semiconductor device 100h. Herein, similarly to Embodiment 7, by the transparent electrode 109 in the contact holes 131 and 135, the source electrode 105 and the oxide semiconductor layer 104 are electrically connected. By the transparent electrode 109 in the contact holes 132 and 136, the drain electrode 106 and the oxide semiconductor layer 104 are electrically connected. In addition, at the bottom of the contact hole 134, the transparent electrode 109 in the Cs portion 70 is electrically connected to the oxide semiconductor layer 104b. In the terminal portion 30, by the transparent electrode 109, the upper layer wiring 117 and the lower layer wiring 102c are electrically connected.

According to this embodiment, the effects by the protecting layer 107 described above in Embodiment 1 can be attained, and the TFT substrate for a display device including the TFT portion 60, the Cs portion 70, and the terminal portion 30 can be formed by four mask processes. Accordingly, the production efficiency of the display device can be improved, and the cost can be reduced.

Embodiment 9

Next, with reference to FIG. 21 and FIG. 22, a semiconductor device 100i in Embodiment 9 of the present invention will be described.

Figure 21:
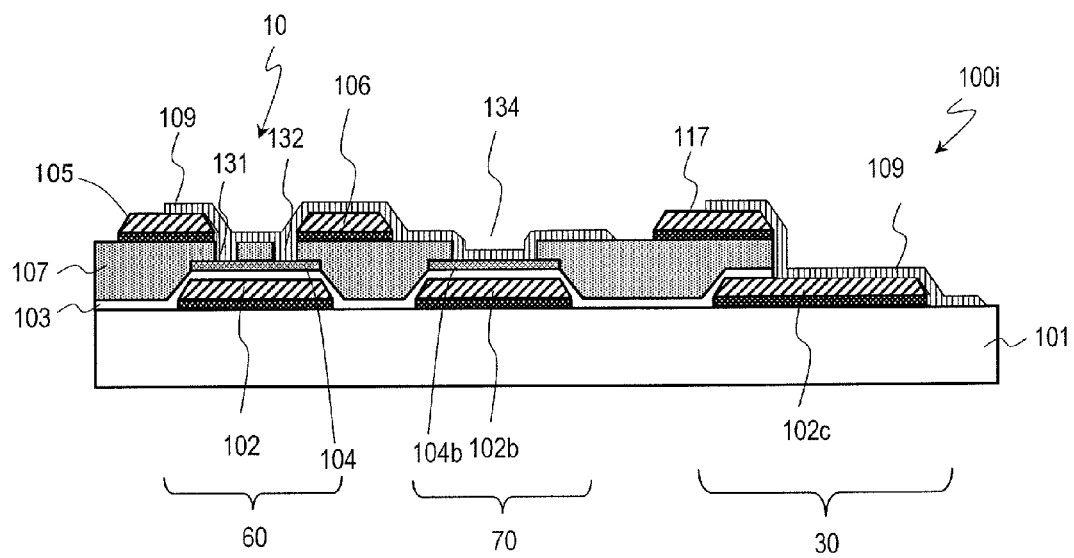
FIG. 21 is a sectional view showing the configuration of a semiconductor device 100i in Embodiment 9 of the present invention.

FIG. 21 is a sectional view schematically showing the configuration of the semiconductor device 100i. The fundamental configuration of the semiconductor device 100i except for the configuration that the protecting layer 110 and the interlayer insulating layer 108 are not formed is the same as that of the semiconductor device 100g in Embodiment 7. The components having the same functions are designated by the same reference numerals, and the detailed descriptions thereof are omitted.

A TFT portion 60 of the semiconductor device 100i includes a gate electrode 102, a gate insulating layer 103, an oxide semiconductor layer 104, a protecting layer 107, a source electrode 105, a drain electrode 106, and a transparent electrode 109, formed on a substrate 101. A Cs portion 70 includes a storage capacitor electrode 102b, the gate insulating layer 103, an oxide semiconductor layer 104b, the protecting layer 107, and the transparent electrode 109, formed on the substrate 101. A terminal portion 30 includes a lower layer wiring 102c, the gate insulating layer 103, the protecting layer 107, an upper layer wiring 117, and the transparent electrode 109, formed on the substrate 101.

Next, with reference to FIG. 22, the production method of the semiconductor device 100i will be described.

Figure 22:
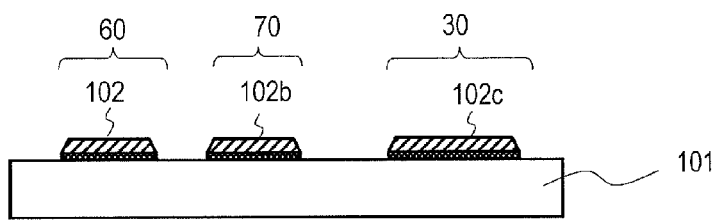
In FIG. 22, (a) to (f) are sectional views schematically showing the production process of the semiconductor device 100i.
Figure 22:
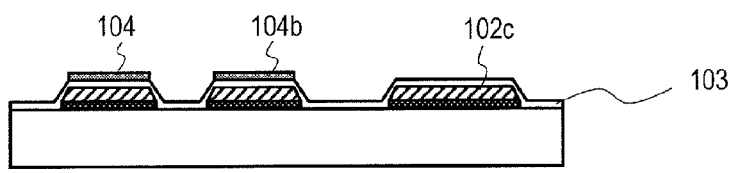
Figure 22:
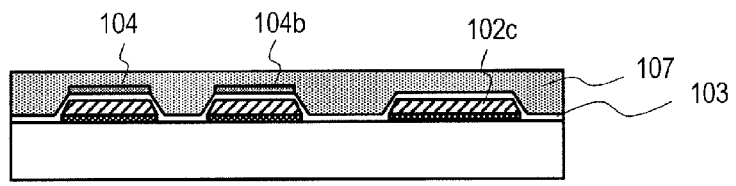
Figure 22:
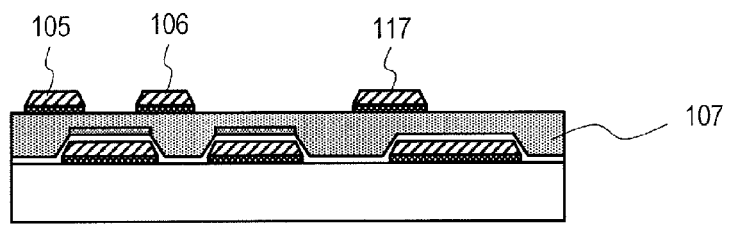
Figure 22:
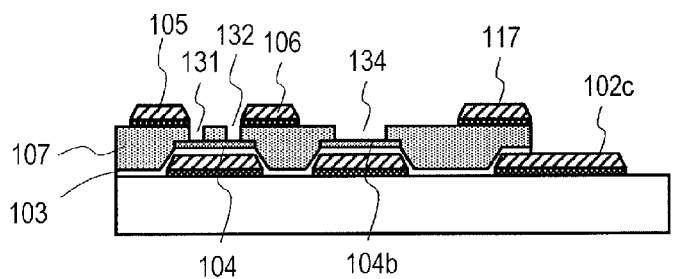
Figure 22:
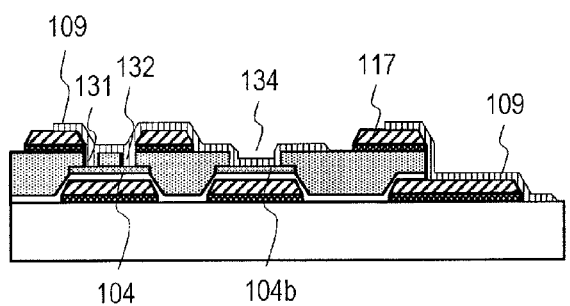

In FIG. 22, (a) to (f) are schematic sectional views showing the production process steps of the semiconductor device 100i.

First, as shown in (a) to (d) of FIG. 22, by the same method as that shown in (a) to (d) of FIG. 18, the gate electrode 102, the storage capacitor electrode 102b, the lower layer wiring 102c, the gate insulating layer 103, the oxide semiconductor layers 104 and 104b, the protecting layer 107, the source electrode 105, the drain electrode 106, the upper layer wiring 117, and the transparent electrode 109 are formed on the substrate 101.

Next, as shown in FIG. 22(e), by photolithography and etching, contact holes 131, 132, and 134 are formed in the protecting layer 107. At the bottoms of the contact holes 131 and 132, the oxide semiconductor layer 104 is exposed. At the bottom of the contact hole 134, the oxide semiconductor layer 104b is exposed. At this time, in the terminal portion 30, the gate insulating layer 103 and the protecting layer 107 on part of the lower layer wiring 102c are removed.

Next, on the protecting layer 107, so as to cover the source electrode 105, the drain electrode 106, and the upper layer wiring 117, e.g. ITO is deposited by sputtering to the thickness of 50 to 200 nm. At this time, the ITO is also deposited on the side faces and the bottom faces of the contact holes 131, 132, and 134, and the exposed face of the terminal portion 30. Next, by photolithography, the transparent electrode layer is patterned. Accordingly, the transparent electrode 109 is formed as shown in FIG. 22(f).

By the transparent electrode 109 in the contact hole 131, the source electrode 105 and the oxide semiconductor layer 104 are electrically connected. By the transparent electrode 109 in the contact hole 132, the drain electrode 106 and the oxide semiconductor layer 104 are electrically connected. At the bottom of the contact hole 134, the transparent electrode 109 of the Cs portion 70 is electrically connected to the oxide semiconductor layer 104b. In the terminal portion 30, by the transparent electrode 109, the upper layer wiring 117 and the lower layer wiring 102c are electrically connected.

According to this embodiment, the effects by the protecting layer 107 which are described above in Embodiment 1 can be attained, and the TFT substrate for a display device including the TFT portion 60, the Cs portion 70, and the terminal portion 30 can be formed by five mask processes. Accordingly, the production efficiency of the display device is improved, and the cost can be reduced.

Embodiment 10

Next, with reference to FIG. 23 and FIG. 24, a semiconductor device 100j in Embodiment 10 of the present invention will be described.

Figure 23:
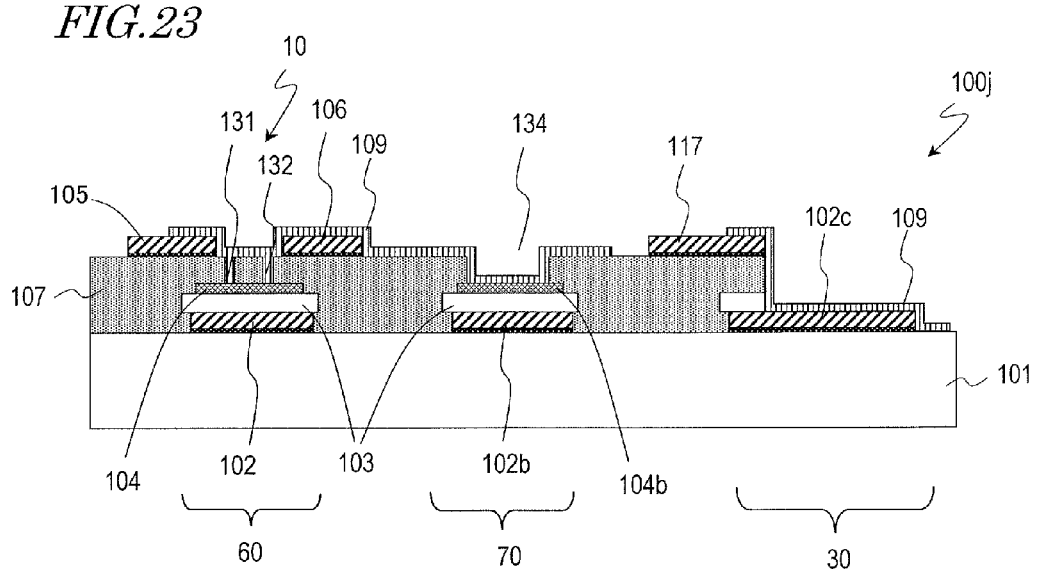
FIG. 23 is a sectional view showing the configuration of a semiconductor device 100j in Embodiment 10 of the present invention.

FIG. 23 is a sectional view schematically showing the configuration of the semiconductor device 100j. The fundamental configuration of the semiconductor device 100j except for the configuration that the protecting layer 110 and the interlayer insulating layer 108 are not formed is the same as that of the semiconductor device 100h in Embodiment 8. The components having the same functions are designated by the same reference numerals, and the detailed descriptions thereof are omitted.

A TFT portion 60 of the semiconductor device 100j includes a gate electrode 102, a gate insulating layer 103, an oxide semiconductor layer 104, a protecting layer 107, a source electrode 105, a drain electrode 106, and a transparent electrode 109, formed on a substrate 101. A Cs portion 70 includes a storage capacitor electrode 102b, the gate insulating layer 103, an oxide semiconductor layer 104b, the protecting layer 107, and the transparent electrode 109, formed on the substrate 101. A terminal portion 30 includes a lower layer wiring 102c, the gate insulating layer 103, the protecting layer 107, an upper layer wiring 117, and the transparent electrode 109, formed on the substrate 101.

Next, with reference to FIG. 24, the production method of the semiconductor device 100j will be described.

Figure 24:
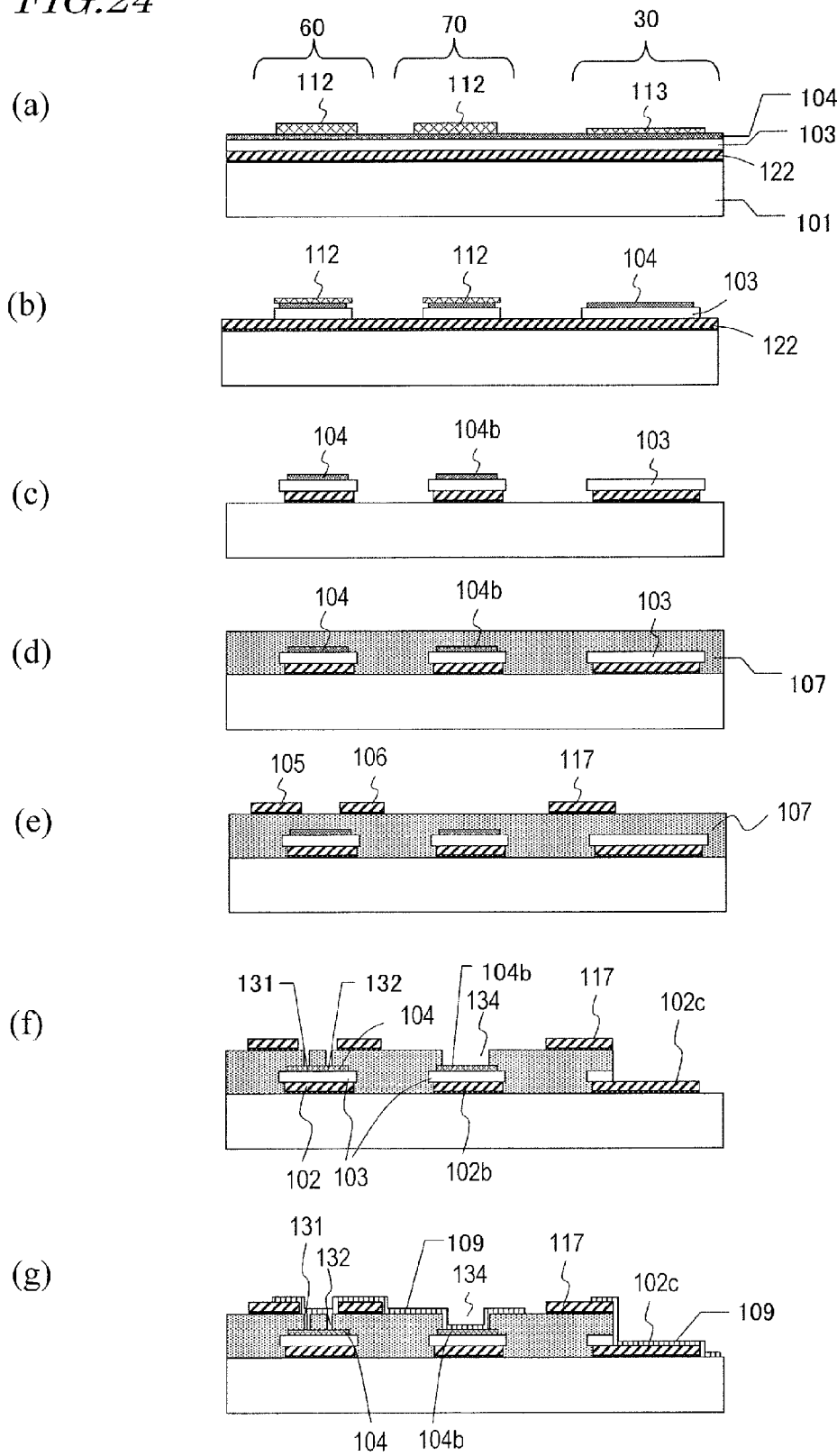
In FIG. 24, (a) to (g) are sectional views schematically showing the production process of the semiconductor device 100j.

In FIG. 24, (a) to (g) are schematic sectional views showing the production process steps of the semiconductor device 100j.

First, as shown in (a) to (e) of FIG. 24, by the same method as that shown in (a) to (e) of FIG. 20, the gate electrode 102, the storage capacitor electrode 102b, the lower layer wiring 102c, the gate insulating layer 103, the oxide semiconductor layers 104 and 104b, the protecting layer 107, the source electrode 105, the drain electrode 106, the upper layer wiring 117, and the transparent electrode 109 are formed on the substrate 101.

Next, as shown in FIG. 24(f), by photolithography and etching, contact holes 131, 132, and 134 are formed in the protecting layer 107. At the bottoms of the contact holes 131 and 132, the oxide semiconductor layer 104 is exposed. At the bottom of the contact hole 134, the oxide semiconductor layer 104b is exposed. At this time, in the terminal portion 30, the gate insulating layer 103 and the protecting layer 107 on part of the lower layer wiring 102c are removed.

Next, on the protecting layer 107, so as to cover the source electrode 105, the drain electrode 106, and the upper layer wiring 117, ITO is deposited by sputtering, for example, to the thickness of 50 to 200 nm. At this time, the ITO is also deposited on the side faces and the bottom faces of the contact holes 131, 132, and 134, and the exposed face of the terminal portion 30. Next, by photolithography, the transparent electrode layer is patterned. Accordingly, the transparent electrode 109 is formed as shown in FIG. 24(g).

By the transparent electrode 109 in the contact hole 131, the source electrode 105 and the oxide semiconductor layer 104 are electrically connected. By the transparent electrode 109 in the contact hole 132, the drain electrode 106 and the oxide semiconductor layer 104 are electrically connected. At the bottom of the contact hole 134, the transparent electrode 109 of the Cs portion 70 is electrically connected to the oxide semiconductor layer 104b. In the terminal portion 30, by the transparent electrode 109, the upper layer wiring 117 and the lower layer wiring 102c are electrically connected.

According to this embodiment, the effects by the protecting layer 107 which are described above in Embodiment 1 can be attained, and the TFT substrate for a display device including the TFT portion 60, the Cs portion 70, and the terminal portion 30 can be formed by four mask processes. Accordingly, the production efficiency of the display device is improved, and the cost can be reduced.

Embodiment 11

Next, with reference to FIG. 25 to FIG. 27, a semiconductor device 100k in Embodiment 11 of the present invention will be described.

Figure 25:
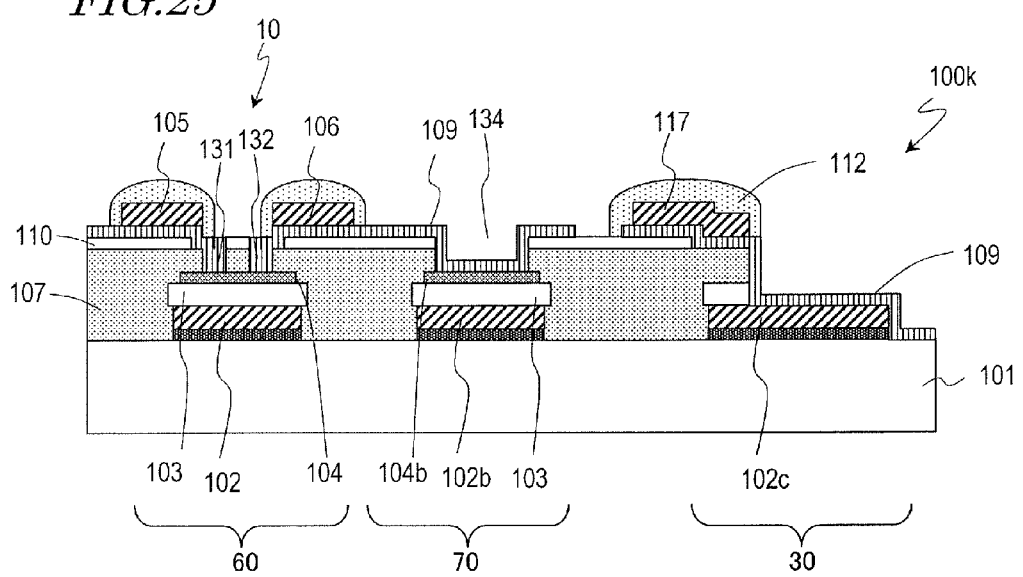
FIG. 25 is a sectional view showing the configuration of a semiconductor device 100k in Embodiment 11 of the present invention.

FIG. 25 is a sectional view schematically showing the configuration of the semiconductor device 100k. The fundamental configuration of the semiconductor device 100k except for the configuration which will be described below is the same as that of the semiconductor device 100h in Embodiment 8. The components having the same functions are designated by the same reference numerals, and the detailed descriptions thereof are omitted.

A TFT portion 60 of the semiconductor device 100k includes a gate electrode 102, a gate insulating layer 103, an oxide semiconductor layer 104, a protecting layer 107, a protecting layer 110, a transparent electrode 109, a source electrode 105, a drain electrode 106, and a resist 112, formed on a substrate 101. Unlike Embodiment 8, the source electrode 105 and the drain electrode 106 are formed on the transparent electrode 109 and covered with the resist 112. The transparent electrode 109 buries contact holes 131 and 132 formed in the protecting layers 107 and 110.

A Cs portion 70 includes a storage capacitor electrode 102b, the gate insulating layer 103, an oxide semiconductor layer 104b, the protecting layer 107, the protecting layer 110, and the transparent electrode 109, formed on the substrate 101. Under the transparent electrode 109, the interlayer insulating layer 108 is not formed.

A terminal portion 30 includes a lower layer wiring 102c, the gate insulating layer 103, the protecting layer 107, the protecting layer 110, an upper layer wiring 117, the transparent electrode 109, and the resist 112, formed on the substrate 101. Part of the transparent electrode 109 is formed on the protecting layer 110, and another part is formed on the protecting layer 107. The upper layer wiring 117 is formed on the transparent electrode 109 and covered with the resist 112.

Next, with reference to FIG. 26 and FIG. 27, the production method of the semiconductor device 100k will be described.

Figure 26:
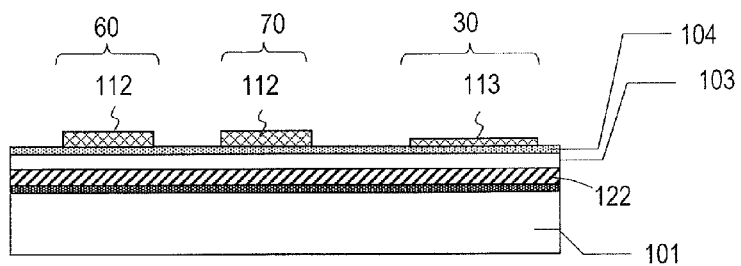
In FIG. 26, (a) to (g) are sectional views schematically showing part of the production process of the semiconductor device 100k.
Figure 26:
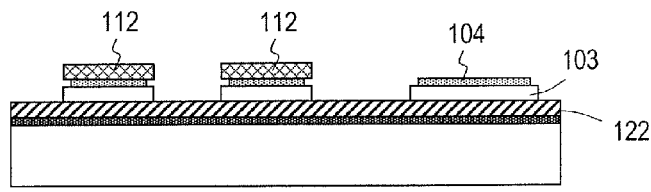
Figure 26:
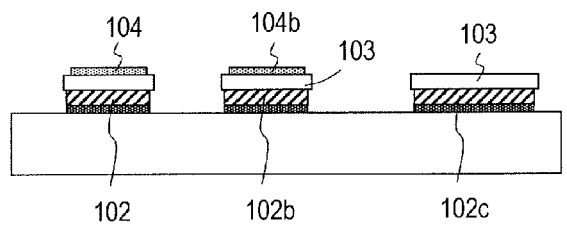
Figure 26:
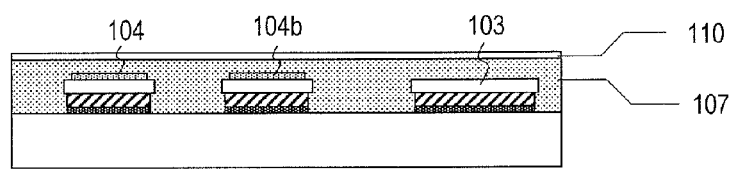
Figure 26:
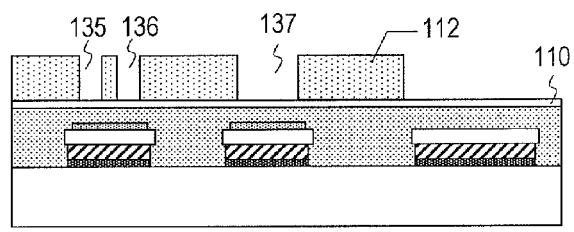
Figure 26:
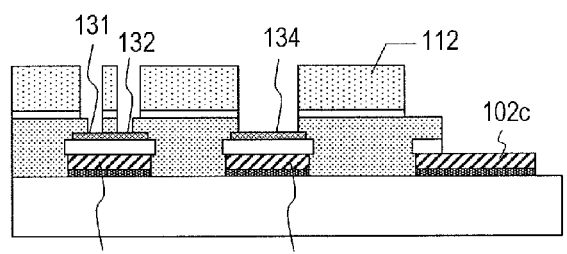
Figure 26:
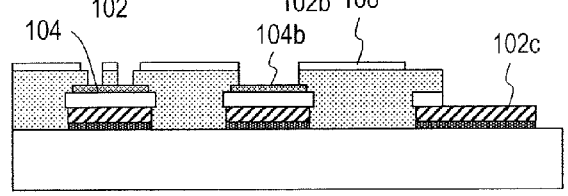
Figure 27:
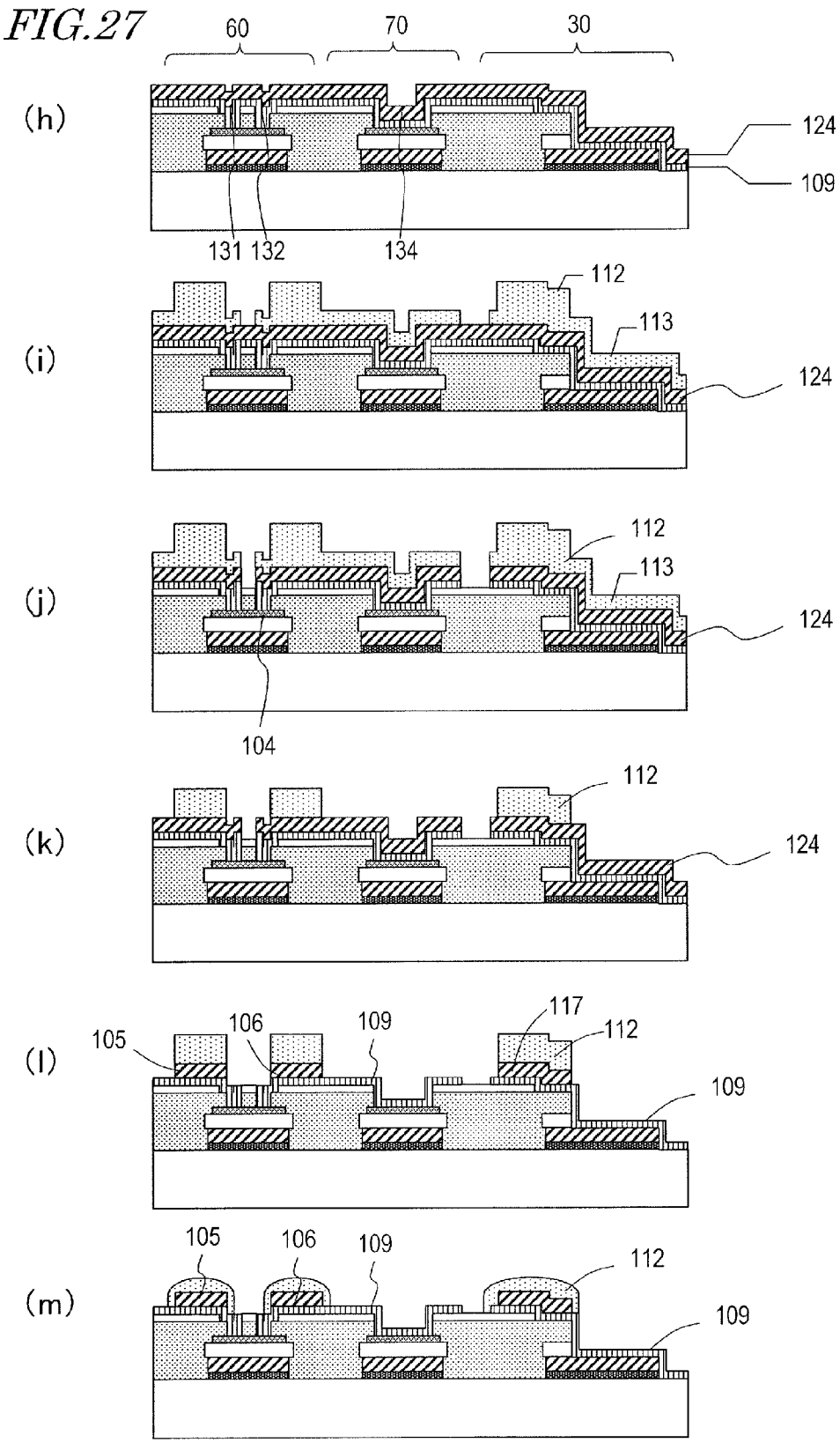
In FIG. 27, (h) to (m) are sectional views schematically showing part of the production process of the semiconductor device 100k.

In FIG. 26, (a) to (g), and in FIG. 27, (h) to (m) are schematic sectional views showing the production process steps of the semiconductor device 100k.

First, as shown in (a) to (c) of FIG. 26, by the same method as that shown in (a) to (c) of FIG. 20, on the substrate 101 of the TFT portion 60, a layered structure of the gate electrode 102, the gate insulating layer 103, and the oxide semiconductor layer 104 is formed. On the substrate 101 of the Cs portion 70, a layered structure of the storage capacitor electrode 102b, the gate insulating layer 103, and the oxide semiconductor layer 104b is formed. On the substrate 101 of the terminal portion 30, a layered structure of the lower layer wiring 102c and the gate insulating layer 103 is formed (the first mask process).

Next, so as to cover the above-described three layered structures, on the substrate 101, an SOG material is applied by spin coating, and the applied SOG material is sintered. The sintering temperature is 200 to 450 degrees. In this embodiment, the sintering is performed at 350 degrees. As the result of the sintering, dehydration polymerization reaction of the SOG material is caused, thereby forming the protecting layer 107 of silicon oxide having the thickness of 100 to 3000 nm (the formation of the protecting layer 107 by SOG technique).

Next, on the protecting layer 107, an oxide layer is layered by CVD, thereby forming the protecting layer 110. The thickness of the protecting layer 110 is 50 to 300 nm. Accordingly, the layered structure shown in FIG. 26(d) is obtained.

Next, a photosensitive resist applied on the protecting layer 110 is selectively removed, thereby forming the resist 112 having contact holes 135, 136, and 137, as shown in FIG. 26(e). The resist located above the terminal portion 30 is removed.

Next, by using the resist 112 as a mask, the protecting layers 110 and 107 are patterned by dry etching (the second mask process), thereby forming the contact holes 131, 132, and 134, as shown in FIG. 26(f). At this time, in the terminal portion 30, the protecting layers 110 and 107 on the lower layer wiring 102c and on part of the upper layer wiring 117 are also removed.

Thereafter, as shown in FIG. 26(g), the remaining resist 112 is removed. Herein, at the bottoms of the contact holes 131 and 132, the oxide semiconductor layer 104 is exposed. At the bottom of the contact hole 134, the oxide semiconductor layer 104b is exposed. In the terminal portion 30, the lower layer wiring 102c is exposed.

Next, by sputtering, as shown in FIG. 27(h), the transparent electrode 109 of e.g. ITO is deposited to the thickness of 50 to 200 nm. In addition, a metal layer 124 of e.g. Cu is deposited to the thickness of 100 to 600 nm. Herein the contact holes 131, 132, and 134 are buried by the transparent electrode 109, or by the transparent electrode 109 and the metal layer 124.

Next, as shown in FIG. 27(i), on the metal layer 124, the resists 112 and 113 are selectively formed. The resist 113 is formed so as to be thinner than the resist 112 by half-tone exposure or gray-tone exposure (the third mask process).

Then, by wet etching, as shown in FIG. 27(j), part of the metal layer 124 and part the transparent electrode 109 are removed.

Next, the resist 112 is partially withdrawn by ashing, thereby removing the resist 112 on the metal layer 124 to be removed, as shown in FIG. 27(k).

Next, by wet etching, the exposed metal layer 124 is removed. Accordingly, as shown in FIG. 27(1), the source electrode 105, the drain electrode 106, and the upper layer wiring 117 are formed. Herein, the transparent electrode 109 remains without being removed.

Next, the remaining resist 112 is not peeled off, but exposed to a solvent atmosphere, heated, and caused to reflow. Accordingly, as shown in FIG. 27(m), the source electrode 105, the drain electrode 106, and the upper layer wiring 117 are not exposed but covered with the resist 112.

It is understood that the process step is not necessarily performed, but in the case where leakage current from the source electrode 105, the drain electrode 106, and the upper layer wiring 117 to the counter electrode is not seriously considered, the resist 112 is not caused to reflow, but may be removed.

In this way, the semiconductor device 100k is completed. Herein, by the transparent electrode 109 in the contact hole 131, the source electrode 105 and the oxide semiconductor layer 104 are electrically connected. By the transparent electrode 109 in the contact hole 132, the drain electrode 106 and the oxide semiconductor layer 104 are electrically connected. At the bottom of the contact hole 134, the transparent electrode 109 of the Cs portion 70 is electrically connected to the oxide semiconductor layer 104b. In the terminal portion 30, by the transparent electrode 109, the upper layer wiring 117 and the lower layer wiring 102c are electrically connected.

According to this embodiment, the effects by the protecting layer 107 described above in Embodiment 1 can be attained, and the TFT substrate for a display device including the TFT portion 60, the Cs portion 70, and the terminal portion 30 can be formed by three mask processes. Thus, the production efficiency of the display device can be further improved, and the cost can be further reduced.

Embodiment 12

Next, a semiconductor device in Embodiment 12 of the present invention will be described.

The semiconductor device in Embodiment 12 has the configuration of the semiconductor device 100k in Embodiment 11 shown in FIG. 25 excluding the protecting layer 110. The other configurations are the same as those of the semiconductor device 100k, so that the descriptions thereof by way of the figures are omitted. The production method of the semiconductor device in Embodiment 12 is the same as that of the semiconductor device 100k excluding the production process step of forming the protecting layer 110 shown in FIG. 26(d), so that the description by way of figures is omitted.

According to this embodiment, the effects of the protecting layer 107 described above in Embodiment 1 can be attained, and the TFT substrate for a display device including the TFT portion 60, the Cs portion 70, and the terminal portion 30 can be formed by three mask processes. Accordingly, the production efficiency of the display device can be further improved, and the cost can be further reduced.

Embodiment 13

Next, an organic EL display device 1002 in Embodiment 13 of the present invention will be described.

Figure 28:
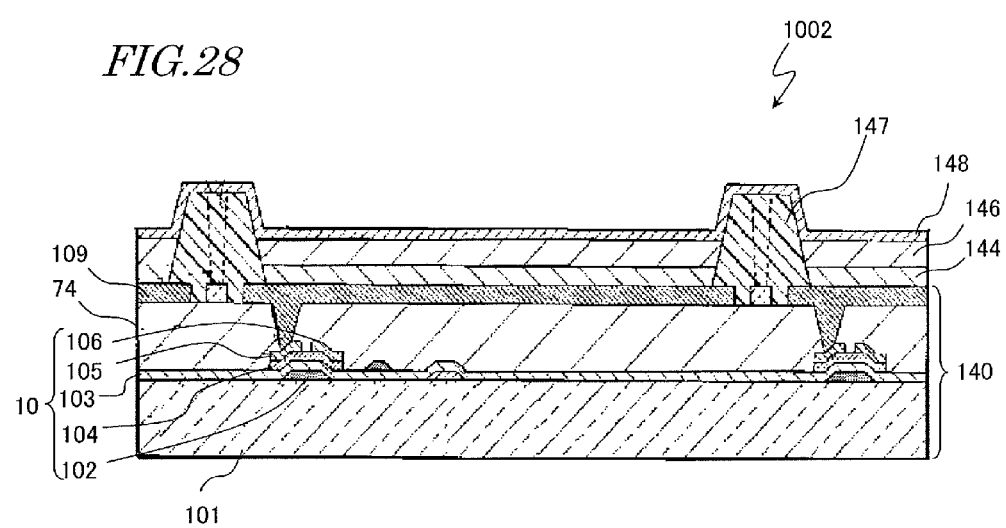
FIG. 28 is a sectional view schematically showing the configuration of an organic EL display device 1002 according to the present invention.
Figure 29:
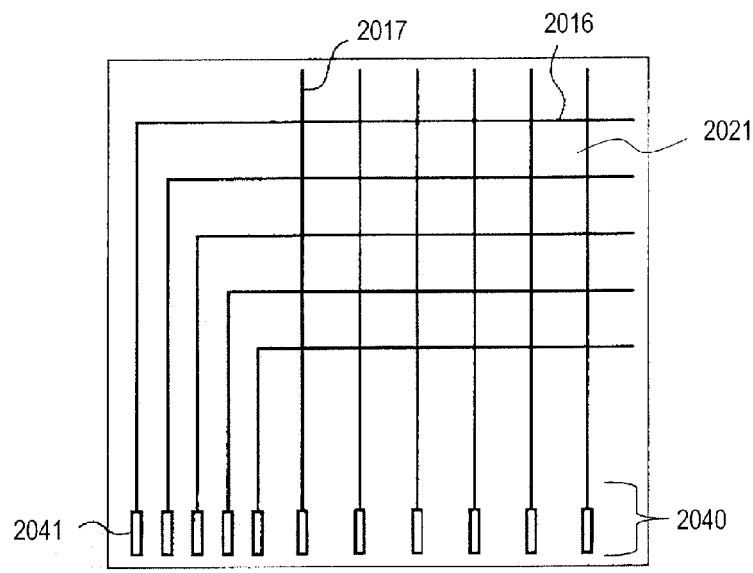
In FIG. 29, (a) is a schematic plan view generally showing a conventional TFT substrate, and (b) is an enlarged plan view showing one pixel on the TFT substrate shown in (a).
Figure 29:
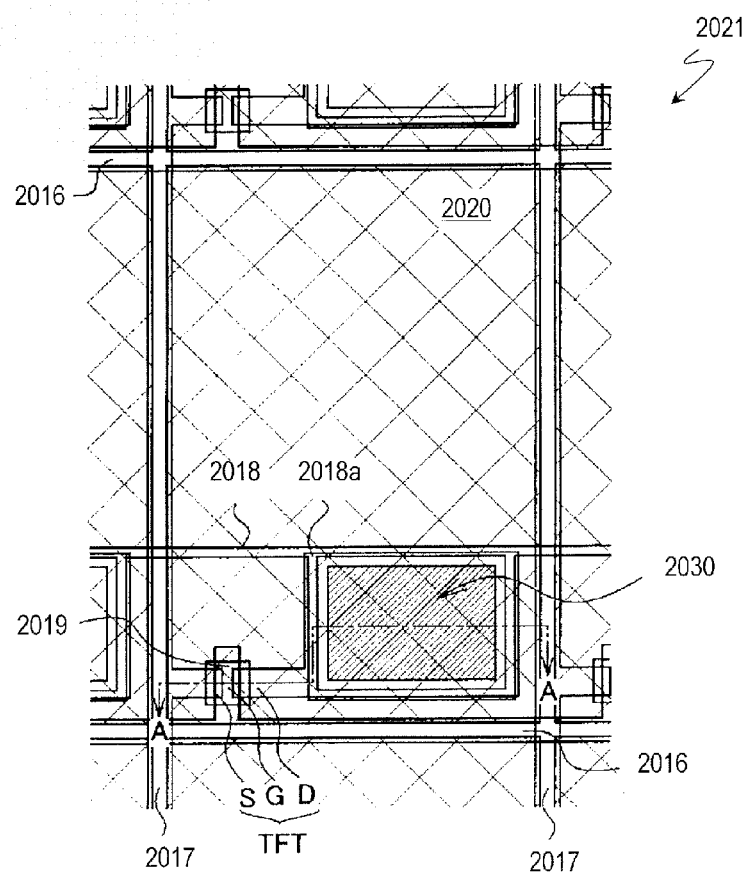
Figure 30:
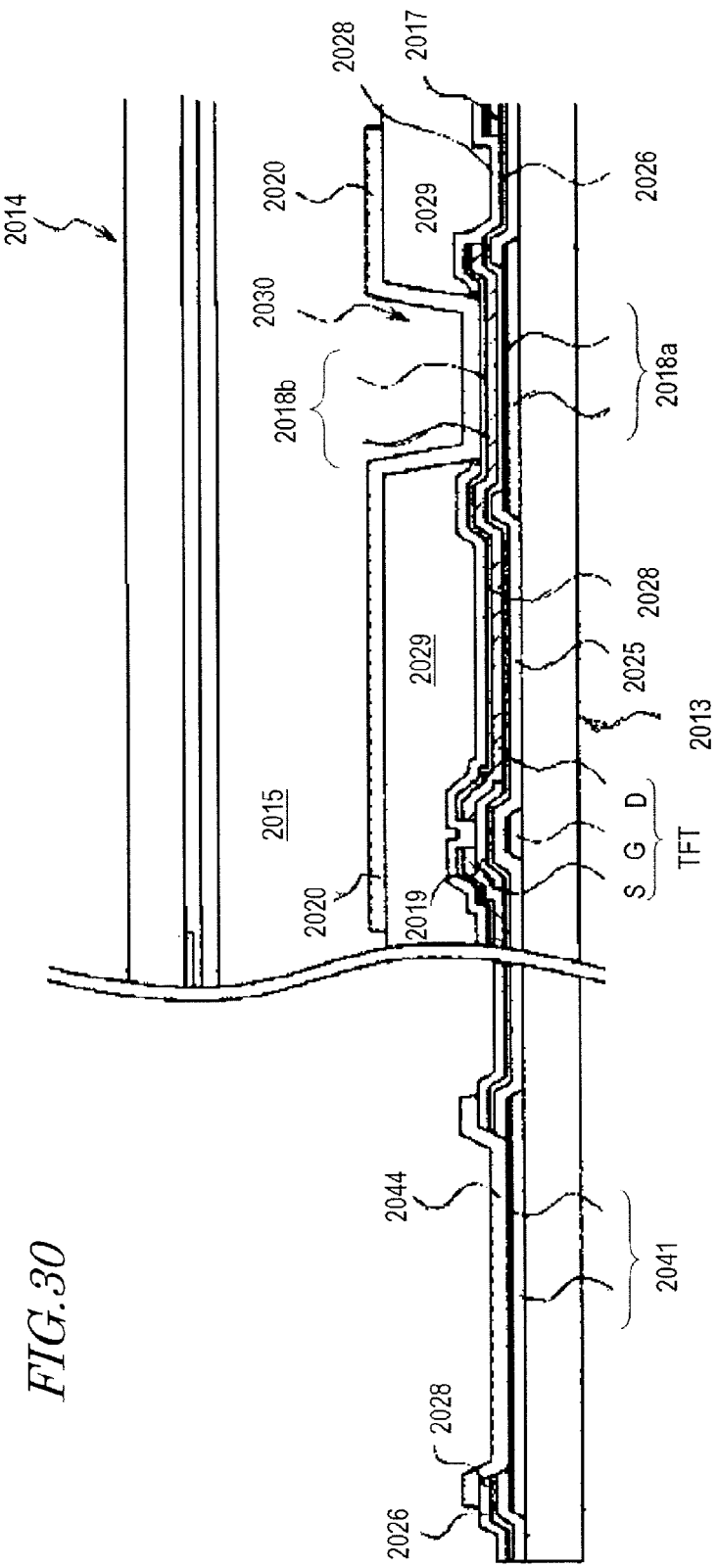
FIG. 30 is a sectional view of a TFT and a terminal portion in the conventional TFT substrate shown in FIG. 29.

FIG. 28 is a sectional view schematically showing the configuration of the organic EL display device 1002 (sometimes referred to simply as "a display device 1002"). As shown in the figure, the display device 1002 includes a TFT substrate 140, a hole transporting layer 144 disposed on the TFT substrate 140, a light emitting layer 146 disposed on the hole transporting layer 144, and a counter electrode 148 disposed on the light emitting layer 146. The hole transporting layer 144 and the light emitting layer 146 constitute an organic EL layer. The organic EL layer is segmented by insulating projections 147. The segmented organic EL layer corresponds to an organic EL layer for one pixel.

The TFT substrate 140 may have fundamentally the same configuration as those of the semiconductor devices in Embodiments 1 to 12. The TFT substrate 140 has a TFT 10 formed on a substrate 101. The TFT substrate 140 may include a Cs portion 70, a terminal portion 30, and the like. In one example of the TFT substrate 140 shown in FIG. 28, the TFT 10 includes a gate electrode 102, a gate insulating layer 103, an oxide semiconductor layer 104, a protecting layer 107 (herein not shown in the figure), a source electrode 105, and a drain electrode 106, formed on the substrate 101. In addition, the TFT substrate 140 includes an interlayer insulating layer 108 layered so as to cover the TFT 10, and a pixel electrode 109 formed on the interlayer insulating layer 108. The pixel electrode 109 is connected to the drain electrode 106 in a contact hole formed in the interlayer insulating layer 108.

A planar construction of the TFT substrate 140 is fundamentally the same as that shown in FIG. 3 and FIG. 4, so that the same components are designated by the same reference numerals and the descriptions thereof are omitted. It is understood that as the TFT substrate 140, a configuration in which a storage capacitor 162 is not provided may be used.

When a voltage is applied across the organic EL layer by the pixel electrode 109 and the counter electrode 148, holes generated from the pixel electrode 109 are transported to the light emitting layer 146 via the hole transporting layer 144. At the same time, electrons generated from the counter electrode 148 are moved to the light emitting layer 146. Such holes and electrons are combined again, so that light emission occurs in the light emitting layer 146. The light emitted from the light emitting layer 146 is controlled for respective pixels by the TFT substrate 140 as the active matrix substrate, thereby performing desired display.

As the materials of the hole transporting layer 144, the light emitting layer 146, and the counter electrode 148, and their layered structure, the known materials and structure may be used. In order to increase the hole injection efficiency, a hole injection layer may be provided between the hole transporting layer 144 and the light emitting layer 146. In order to increase the light emission efficiency, and to attain high electron injection efficiency to the organic EL layer, for the counter electrode 148, a material with high transmittance and small work function may preferably be used.

The organic EL display device 1002 in this embodiment utilizes the semiconductor device described in any one of Embodiments 1 to 12 as its TFT substrate, so that the effects described in Embodiments 1 to 12 can be attained. According to this embodiment, the organic EL display device 1002 which can perform display with high performance can be provided with good production efficiency.

In the production methods of the semiconductor device and the display device according to the present invention, the protecting layer is formed on the oxide semiconductor layer by the spin-on-glass technique, so that the damage to the oxide semiconductor layer when an upper layer such as the source and drain electrodes is formed can be prevented or reduced. Thus, it is possible to provide a semiconductor device and a display device having high quality and high reliability.

In addition, in the semiconductor device and the display device according to the present invention, the protecting layer of spin-on-glass material is disposed so as to be in contact with the oxide semiconductor layer, so that the damage to the oxide semiconductor layer occurring in the production can be prevented. Accordingly, a semiconductor device and a display device having high quality and high reliability can be obtained.

In addition, according to the production method of the present invention, $H_2O$ or —OH radical is diffused from the spin-on-glass material to the oxide semiconductor layer, so that the defect of the oxide semiconductor can be restored. Accordingly, it is possible to provide a semiconductor device and a display device having high quality and high reliability.

According to the present invention, it is possible to provide a display device including a semiconductor TFT of high quality, a storage capacitor, and a terminal portion with good production efficiency.

INDUSTRIAL APPLICABILITY

The present invention is suitably utilized for a semiconductor device having a thin film transistor, and a display device such as a liquid crystal display device or an organic EL display device provided with a thin film transistor in a TFT substrate.

REFERENCE SIGNS LIST

10 TFT (Thin Film Transistor)
25 electric element
30 terminal portion
50 pixel
60 TFT portion
70 Cs portion (storage capacitor portion)
100, 100b to 100k, 140 TFT substrate (semiconductor device)
101 substrate
102 gate electrode
102b storage capacitor electrode
102c lower layer wiring
103 insulating layer (gate insulating layer)
104, 104b oxide semiconductor layer
105 source electrode
105a upper layer source electrode
105b lower layer source electrode
106 drain electrode
106a upper layer drain electrode
106b lower layer drain electrode
107 protecting layer (SOG layer)
108 interlayer insulating layer
109 transparent electrode (pixel electrode)
110 protecting layer (second protecting layer)
112, 113 resist
114 oxide layer (conductive layer)
117 upper layer wiring 122 metal layer
122a upper metal layer
122b lower metal layer
124 metal layer
131 to 137 contact holes
152 signal line
160 scanning line
162 storage capacitor line
200 counter substrate
201 substrate (glass substrate)
202 black matrix
203 color filter
204 counter electrode
205 photo spacer
210, 220 polarizing plate
230 backlight unit
240 scanning line driving circuit
250 signal line driving circuit
260 control circuit
1000 liquid crystal display device
1002 organic EL display device

The invention claimed is:

1. A production method of a display device including a transistor portion having a thin film transistor, a Cs portion having a pixel electrode and a storage capacitor, and a terminal portion having a connecting portion for connecting an upper layer wiring and a lower layer wiring, comprising the steps of:
   (A2) forming a gate electrode, a gate insulating layer, and an oxide semiconductor layer of the thin film transistor, the storage capacitor of the Cs portion, and the lower layer wiring of the terminal portion, on a substrate;
   (B2) forming a protecting layer by a spin-on-glass technique so as to cover the oxide semiconductor layer, the storage capacitor, and the lower layer wiring;
   (C2) forming a source electrode and a drain electrode of the thin film transistor, and the upper layer wiring of the terminal portion, on the protecting layer;
   (D2) forming a first and a second contact holes in the protecting layer in the transistor portion, forming a third contact hole in the protecting layer on the storage capacitor, and removing the protecting layer on at least part of the lower layer wiring of the terminal portion; and
   (E2) forming a transparent electrode on the first, second, and third contact holes, and in the terminal portion, wherein
   the source electrode and the drain electrode, and the oxide semiconductor layer are electrically connected via the transparent electrode, the transparent electrode and a counter electrode of the storage capacitor are electrically connected in the Cs portion, and the lower layer wiring and the upper layer wiring are electrically connected via the transparent electrode in the terminal portion; and
   the production method further comprising, between steps (C2) and (D2):
     a step of forming an interlayer insulating layer so as to cover the source electrode, the drain electrode, and the upper layer wiring;
     a step of forming a second protecting layer on the interlayer insulating layer; and
     a step of forming a plurality of contact holes in the second protecting layer; and
   in the step (D2), the interlayer insulating layer and the protecting layer under the plurality of contact holes are removed, thereby forming the first, second and third contact holes.

2. The production method of a display device of claim 1, wherein the oxide semiconductor is made of an In—Ga—Zn—O semiconductor.

3. The production method of a display device of claim 1, wherein the step (B2) of forming the protecting layer includes:
   a step of applying a spin-on-glass material onto the oxide semiconductor layer and the gate insulating layer by a spin-on-glass technique; and
   a step of sintering the applied spin-on-glass material.

4. The production method of a display device of claim 3, wherein in the sintering step, the protecting layer of silicon oxide is obtained due to dehydration polymerization reaction of the spin-on-glass material.

5. The production method of a display device of claim 4, wherein the spin-on-glass material includes silanol, alkoxysilane, or an organic siloxane resin.

6. The production method of a display device of claim 5, wherein the sintering temperature in the sintering step is 200 to 450° C.

7. A production method of a display device including a transistor portion having a thin film transistor, a Cs portion having a pixel electrode and a storage capacitor, and a terminal portion having a connecting portion for connecting an upper layer wiring and a lower layer wiring, comprising the steps of:
   (A2) forming a gate electrode, a gate insulating layer, and an oxide semiconductor layer of the thin film transistor, the storage capacitor of the Cs portion, and the lower layer wiring of the terminal portion, on a substrate;
   (B2) forming a protecting layer by a spin-on-glass technique so as to cover the oxide semiconductor layer, the storage capacitor, and the lower layer wiring;
   (C2) forming a source electrode and a drain electrode of the thin film transistor, and the upper layer wiring of the terminal portion, on the protecting layer;
   (D2) forming a first and a second contact holes in the protecting layer in the transistor portion, forming a third contact hole in the protecting layer on the storage capacitor, and removing the protecting layer on at least part of the lower layer wiring of the terminal portion; and
   (E2) forming a transparent electrode on the first, second, and third contact holes, and in the terminal portion; wherein
   the source electrode and the drain electrode, and the oxide semiconductor layer are electrically connected via the transparent electrode, the transparent electrode and a counter electrode of the storage capacitor are electrically connected in the Cs portion, and the lower layer wiring and the upper layer wiring are electrically connected via the transparent electrode in the terminal portion; and
   in the step (E2), the transparent electrode is formed so as to be directly in contact with the source electrode and the drain electrode of the thin film transistor, the counter electrode of the storage capacitor, and the lower layer wiring and the upper layer wiring of the terminal portion.

8. The production method of a display device of claim 7, wherein the oxide semiconductor is made of an In—Ga—Zn—O semiconductor.

9. The production method of a display device of claim 7, wherein the step (B2) of forming the protecting layer includes:
   a step of applying a spin-on-glass material onto the oxide semiconductor layer and the gate insulating layer by a spin-on-glass technique; and
   a step of sintering the applied spin-on-glass material.

10. The production method of a display device of claim 9, wherein in the sintering step, the protecting layer of silicon oxide is obtained due to dehydration polymerization reaction of the spin-on-glass material.

11. The production method of a display device of claim 10, wherein the spin-on-glass material includes silanol, alkoxysilane, or an organic siloxane resin.

12. The production method of a display device of claim 11, wherein the sintering temperature in the sintering step is 200 to 450° C.

13. A production method of a display device including a transistor portion having a thin film transistor, a Cs portion having a pixel electrode and a storage capacitor, and a terminal portion having a connecting portion for connecting an upper layer wiring and a lower layer wiring, comprising the steps of:
- (A2) forming a gate electrode, a gate insulating layer, and an oxide semiconductor layer of the thin film transistor, the storage capacitor of the Cs portion, and the lower layer wiring of the terminal portion, on a substrate;
- (B2) forming a protecting layer by a spin-on-glass technique so as to cover the oxide semiconductor layer, the storage capacitor, and the lower layer wiring;
- (C2) forming a source electrode and a drain electrode of the thin film transistor, and the upper layer wiring of the terminal portion, on the protecting layer;
- (D2) forming a first and a second contact holes in the protecting layer in the transistor portion, forming a third contact hole in the protecting layer on the storage capacitor, and removing the protecting layer on at least part of the lower layer wiring of the terminal portion; and
- (E2) forming a transparent electrode on the first, second, and third contact holes, and in the terminal portion, wherein the source electrode and the drain electrode, and the oxide semiconductor layer are electrically connected via the transparent electrode, the transparent electrode and a counter electrode of the storage capacitor are electrically connected in the Cs portion, and the lower layer wiring and the upper layer wiring are electrically connected via the transparent electrode in the terminal portion; and the step (C2) is performed after the steps (D2) and (E2), thereby forming the source electrode, the drain electrode, and the upper layer wiring of the terminal portion on the transparent electrode.

14. The production method of a display device of claim 13, wherein the oxide semiconductor is made of an In—Ga—Zn—O semiconductor.

15. The production method of a display device of claim 13, wherein the step (B2) of forming the protecting layer includes:
- a step of applying a spin-on-glass material onto the oxide semiconductor layer and the gate insulating layer by a spin-on-glass technique; and
- a step of sintering the applied spin-on-glass material.

16. The production method of a display device of claim 15, wherein in the sintering step, the protecting layer of silicon oxide is obtained due to dehydration polymerization reaction of the spin-on-glass material.

17. The production method of a display device of claim 16, wherein the spin-on-glass material includes silanol, alkoxysilane, or an organic siloxane resin.

18. The production method of a display device of claim 17, wherein the sintering temperature in the sintering step is 200 to 450° C.

* * * * *